US012563767B2

(12) United States Patent
Lee et al.

(10) Patent No.: US 12,563,767 B2
(45) Date of Patent: Feb. 24, 2026

(54) METHOD FOR FORMING A FIELD-EFFECT TRANSISTOR HAVING A FRACTIONALLY ENHANCED BODY STRUCTURE

(71) Applicant: Texas Instruments Incorporated, Dallas, TX (US)

(72) Inventors: Meng-Chia Lee, Allen, TX (US); Sunglyong Kim, Allen, TX (US); Seetharaman Sridhar, Richardson, TX (US); Sameer Pendharkar, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 526 days.

(21) Appl. No.: 17/490,918

(22) Filed: Sep. 30, 2021

(65) Prior Publication Data

US 2023/0101610 A1     Mar. 30, 2023

(51) Int. Cl.
   *H10D 30/60*      (2025.01)
   *H10D 30/63*      (2025.01)
   *H10D 30/66*      (2025.01)
(52) U.S. Cl.
   CPC ........... *H10D 30/611* (2025.01); *H10D 30/63* (2025.01); *H10D 30/668* (2025.01)
(58) Field of Classification Search
   CPC ............. H01L 29/7831; H01L 29/7813; H01L 29/7827; H01L 29/66727; H01L 29/66734;

(Continued)

(56) References Cited

U.S. PATENT DOCUMENTS

2002/0009854 A1* 1/2002 Hshieh ................. H10D 30/668
                                              257/E29.066
2010/0264486 A1* 10/2010 Denison ............... H10D 64/117
                                              438/270

(Continued)

FOREIGN PATENT DOCUMENTS

JP          2009531850 A      9/2009
KR      1019990037016 A      5/1999

(Continued)

OTHER PUBLICATIONS

Chen, Wen-Yi et al. "Characterization of SOA in Time Domain and the Improvement Techniques for Using in High-Voltage Integrated Circuits," IEEE Transactions on Device and Materials Reliability, vol. 12, No. 2, Jun. 2012, pp. 382-390.

(Continued)

*Primary Examiner* — Wael M Fahmy
*Assistant Examiner* — Tiberiu Dan Onuta
(74) *Attorney, Agent, or Firm* — Andrew R. Ralston; Frank D. Cimino

(57) ABSTRACT

An integrated circuit includes an epitaxial layer over a semiconductor substrate. The epitaxial layer has a first conductivity type and a top surface. First, second and third trenches are located in the epitaxial layer. The trenches respectively include first, second and third field plates. First and second body members are located within the epitaxial layer and have a different second conductivity type. The first body member is located between the first and second trenches, and the second body member is located between the second and third trenches. The first body member extends a first distance between the top surface and the substrate, and the second body member extends a lesser second distance between the top surface and the substrate.

19 Claims, 17 Drawing Sheets

(58) Field of Classification Search
CPC .......... H01L 29/0696; H01L 29/42376; H01L
29/1095; H01L 29/41766; H01L 29/407
See application file for complete search history.

(56) References Cited

U.S. PATENT DOCUMENTS

| | | | |
|---|---|---|---|
| 2011/0254088 A1 | 10/2011 | Darwish et al. | |
| 2018/0374922 A1* | 12/2018 | Pan | H01L 21/26533 |
| 2019/0115436 A1* | 4/2019 | Hossain | H10D 64/513 |
| 2020/0212219 A1 | 7/2020 | Kim et al. | |
| 2020/0312710 A1 | 10/2020 | Yang et al. | |
| 2021/0151599 A1* | 5/2021 | Magri' | H10D 62/235 |

FOREIGN PATENT DOCUMENTS

| | | | |
|---|---|---|---|
| KR | 1020100122280 A | 11/2010 | |
| WO | WO-2006011882 A1 * | 2/2006 | H10D 62/157 |

OTHER PUBLICATIONS

Chang, Mo-Huai et al. "Optimizing the Trade-off Between the RDS(on) of Power MOSFETs and Linear Mode Performance by Local Modification of MOSFET Gain," Proceedings of the 2016 28th International Symposium on Power Semiconductor Devices and ICs (ISPSD), Jun. 12-16, 2016, Prague, Czech Republic, pp. 379-382.

Toshiba, "MOSFET Self-Turn-On Phenomenon." Application Notes, Jul. 26, 2018, 19 pages. Retrieved from: https://toshiba.semicon-storage.com/info/docget.jsp?did=59473.

Khan, Tahir et al. "Rugged Dotted-channel LDMOS structure," 2008 IEEE International Electron Devices Meeting, Dec. 15-17, 2008, 4 pages.

International Search Report, Application No. PCT/US2022/045027, dated Jan. 18, 2023, 3 pages.

\* cited by examiner

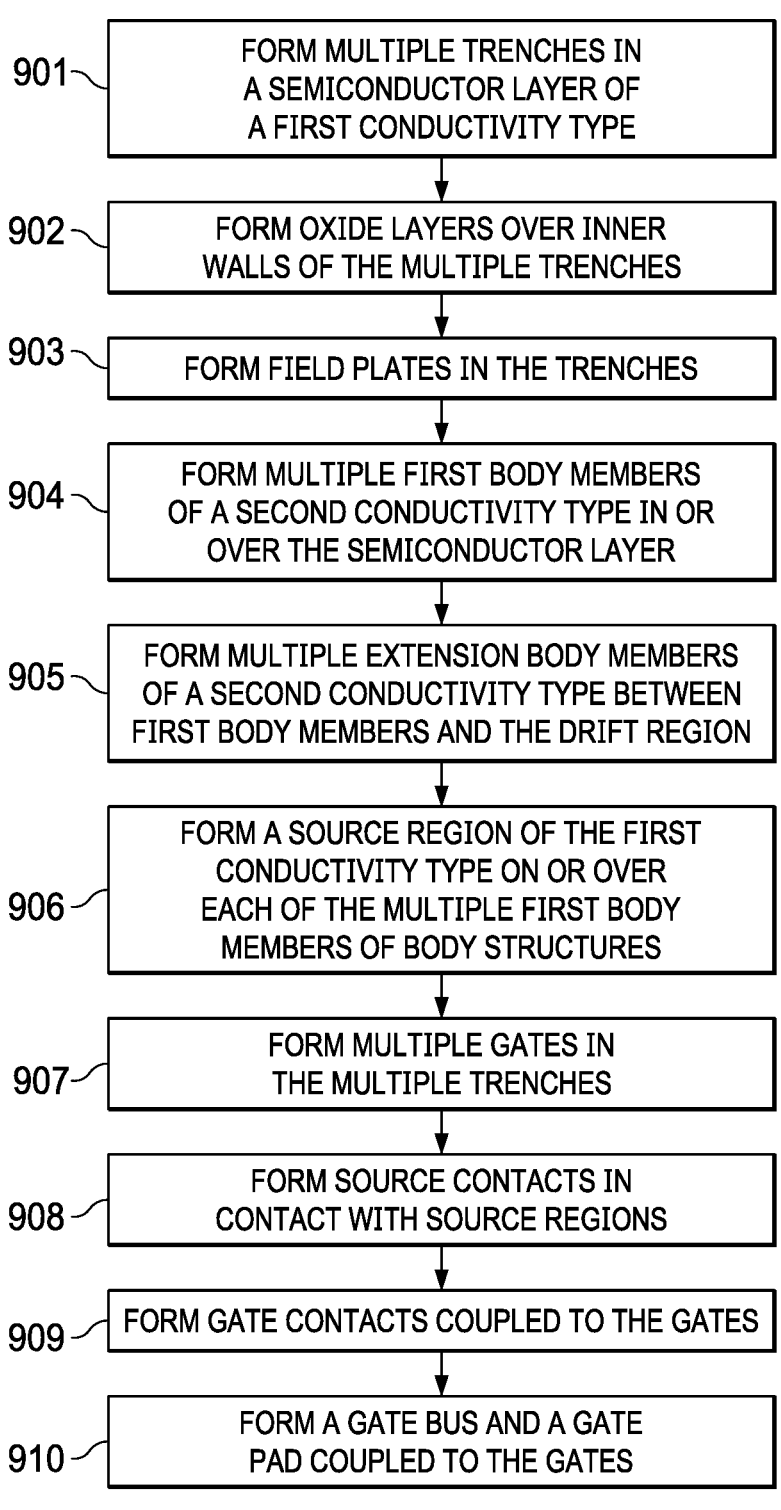

901 — FORM MULTIPLE TRENCHES IN A SEMICONDUCTOR LAYER OF A FIRST CONDUCTIVITY TYPE

902 — FORM OXIDE LAYERS OVER INNER WALLS OF THE MULTIPLE TRENCHES

903 — FORM FIELD PLATES IN THE TRENCHES

904 — FORM MULTIPLE FIRST BODY MEMBERS OF A SECOND CONDUCTIVITY TYPE IN OR OVER THE SEMICONDUCTOR LAYER

905 — FORM MULTIPLE EXTENSION BODY MEMBERS OF A SECOND CONDUCTIVITY TYPE BETWEEN FIRST BODY MEMBERS AND THE DRIFT REGION

906 — FORM A SOURCE REGION OF THE FIRST CONDUCTIVITY TYPE ON OR OVER EACH OF THE MULTIPLE FIRST BODY MEMBERS OF BODY STRUCTURES

907 — FORM MULTIPLE GATES IN THE MULTIPLE TRENCHES

908 — FORM SOURCE CONTACTS IN CONTACT WITH SOURCE REGIONS

909 — FORM GATE CONTACTS COUPLED TO THE GATES

910 — FORM A GATE BUS AND A GATE PAD COUPLED TO THE GATES

FIG. 9

METHOD FOR FORMING A FIELD-EFFECT TRANSISTOR HAVING A FRACTIONALLY ENHANCED BODY STRUCTURE

TECHNICAL FIELD

The disclosure is directed in general to integrated circuits (ICs) and, more specifically, but not exclusively, to ICs including vertical trench gate MOSFETs.

BACKGROUND

Metal-oxide-semiconductor field-effect transistor (MOSFET) devices have a broad range of applications, such as power management. A safe operating area (SOA) of the MOSFET describes the voltage and current conditions over which the device can be expected to operate without being damaged.

SUMMARY

Various disclosed methods and devices of the present disclosure may be beneficially applied to integrated circuits having a trench-gate MOSFET with reduced cell pitch. While such embodiments may be expected to provide improvements in performance, such as improved thermal stability and reduced or eliminated risk of undesired self turn-on induced by rapid voltage change, no particular result is a requirement unless explicitly recited in a particular claim.

In one example, an integrated circuit includes an epitaxial layer over a semiconductor substrate. The epitaxial layer has a first conductivity type and a top surface. First, second and third trenches are located in the epitaxial layer. The trenches respectively include first, second and third field plates. First and second body members are located within the epitaxial layer and have a different second conductivity type. The first body member is located between the first and second trenches, and the second body member is located between the second and third trenches. The first body member extends a first distance between the top surface and the substrate, and the second body member extends a lesser second distance between the top surface and the substrate.

In another example, a method of forming an integrated circuit includes forming first, second and third trenches in an epitaxial layer having a first conductivity type over a substrate. A polysilicon field plate is formed within each of the trenches. A first body region having an opposite second conductivity type between the first and second trenches is formed. The first body region has a first depth below a top surface of the epitaxial layer. A second body region having the second conductivity type between the second and third trenches is formed. The second body region has a greater second depth below the top surface.

In another example, a method of forming an integrated circuit includes forming first, second and third trenches in an epitaxial layer located over a semiconductor substrate. The epitaxial layer has a first conductivity type and a top surface. First, second and third field plates are formed respectively within the first, second and third trenches. A first body member is formed within the epitaxial layer between the first and second trenches. The first body member has a different second conductivity type and extends into the epitaxial layer a first distance between the top surface and the substrate. A second body member is formed within the epitaxial layer between the second and third trenches. The second body member has the different second conductivity type and extending into the epitaxial layer a lesser second distance between the top surface and the substrate.

BRIEF DESCRIPTION OF THE DRAWINGS

For a detailed description of various examples, reference will now be made to the accompanying drawings in which:

FIG. 9 illustrates a flow chart of an example method for forming the example MOSFET integrated circuit of FIGS. 7 and 8;

DETAILED DESCRIPTION

As technology nodes become smaller and transistor channel densities increase, the zero temperature coefficients (ZTC) (or ZTC points) are increased and become worse, metal-oxide-semiconductor field-effect transistors (MOSFETs) may have decreased safe-operating-areas (SOA) and may thus operate in a thermally unstable region. Further, false turn-on (e.g., MOSFET being turned on unexpectedly) can occur due to rapid voltage changes during transistor switching.

Figure 19:
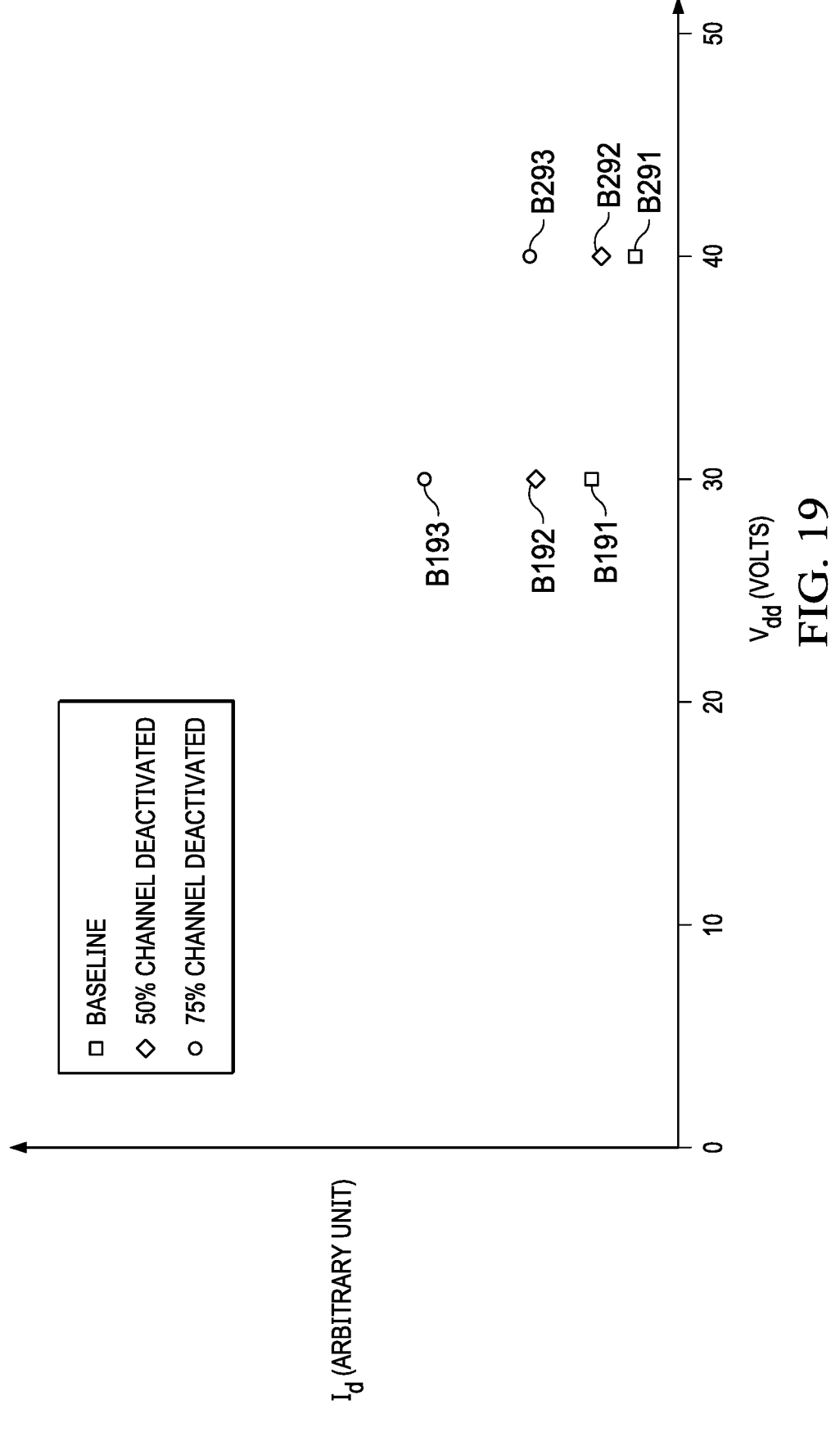
FIG. 19 illustrates SOA improvement in example integrated circuits as compared a baseline integrated circuit.

The present disclosure is directed to FETs with improved thermal SOA (e.g., increased drain current under operation without self-damage as shown in FIG. 19), reduced risk of self turn-on, and improved figure of merit (Qgd*Rsp, the product of gate-to-source charge and specific on-resistance). Such FETs may be beneficially employed, for example, in integrated circuits in applications with reduced cell pitch.

The described examples include an integrated circuit (IC) with a trench-gate MOSFET that includes a drift region having a first conductivity type, a body structure having a second opposite conductivity type and adjacent to the drift region, a source region having the first conductivity type, and a gate adjacent the body structure. The body structure includes a first body member and one or more extension body members between the first body member and the drift region and extends to a location farther than the gate along a first direction pointing from the source region towards the drift region. Because some portions (but not necessarily all portions) of first body members have corresponding extension body members, the extension body members can be fractionally (e.g., partially) enhanced (or extended) and can disable or weaken partial channel of MOSFETs of the integrated circuit. The extension body members can cause the drift resistance temperature coefficient to become more dominant as compared to the channel of the body structure, and can reduce gate-to-drain capacitance. Thermal SOA can be improved, QgdRsp, (gate-to-source charge specific on-resistance) can be reduced, and the risk of false self turn-on can be reduced.

FIGS. 1-8 illustrate schematic views of various stages of the formation of an example MOSFET integrated circuit 100; and FIG. 9 illustrates a corresponding flow chart of an example method for forming the example MOSFET inte-grated circuit 100. FIGS. 1-8 will now be described along with references to the flow chart of FIG. 9. Additional details of forming some features of the MOSFET integrated circuit 100 may be found in U.S. patent application Ser. No. 16/237,210, (now U.S. Pat. No. 11,658,241) incorporated by reference herein in its entirety.

Figure 1:
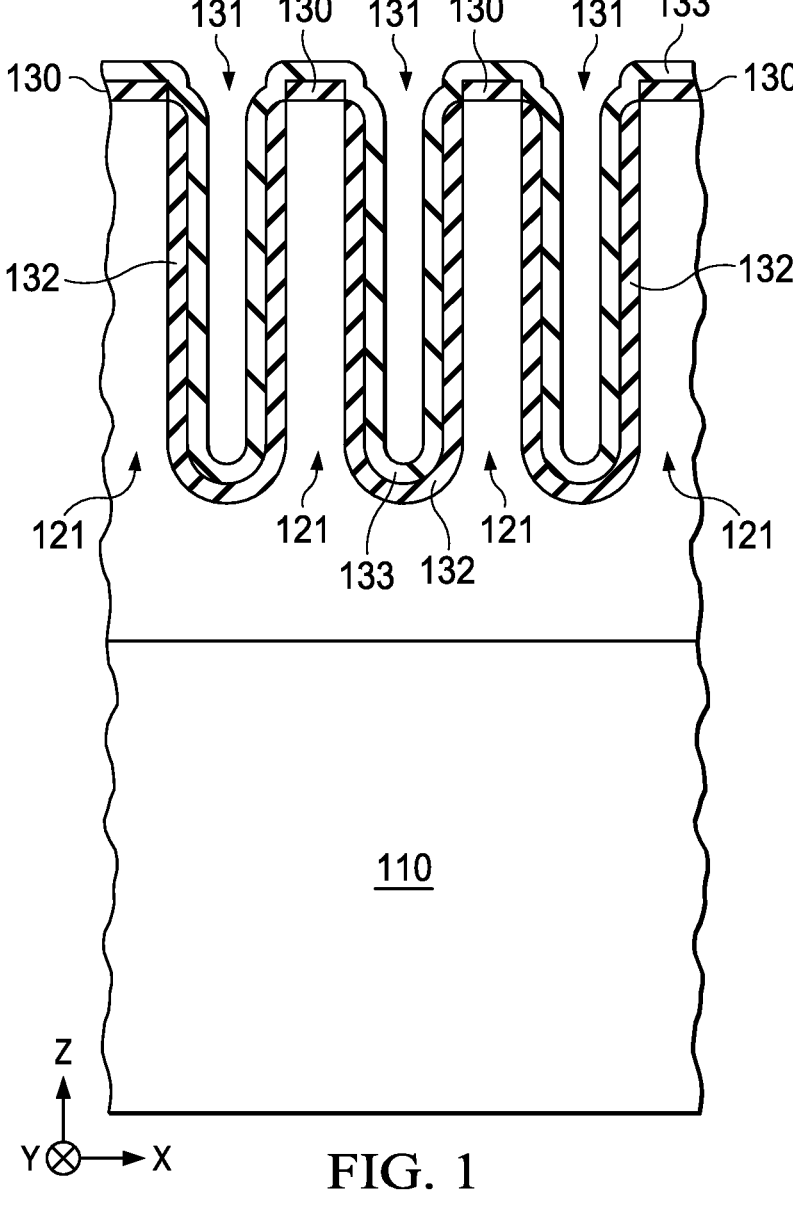
FIGS. 1 to 8 illustrate schematic views of various stages of the formation of an example MOSFET-based integrated circuit according to described examples.
Figure 2:
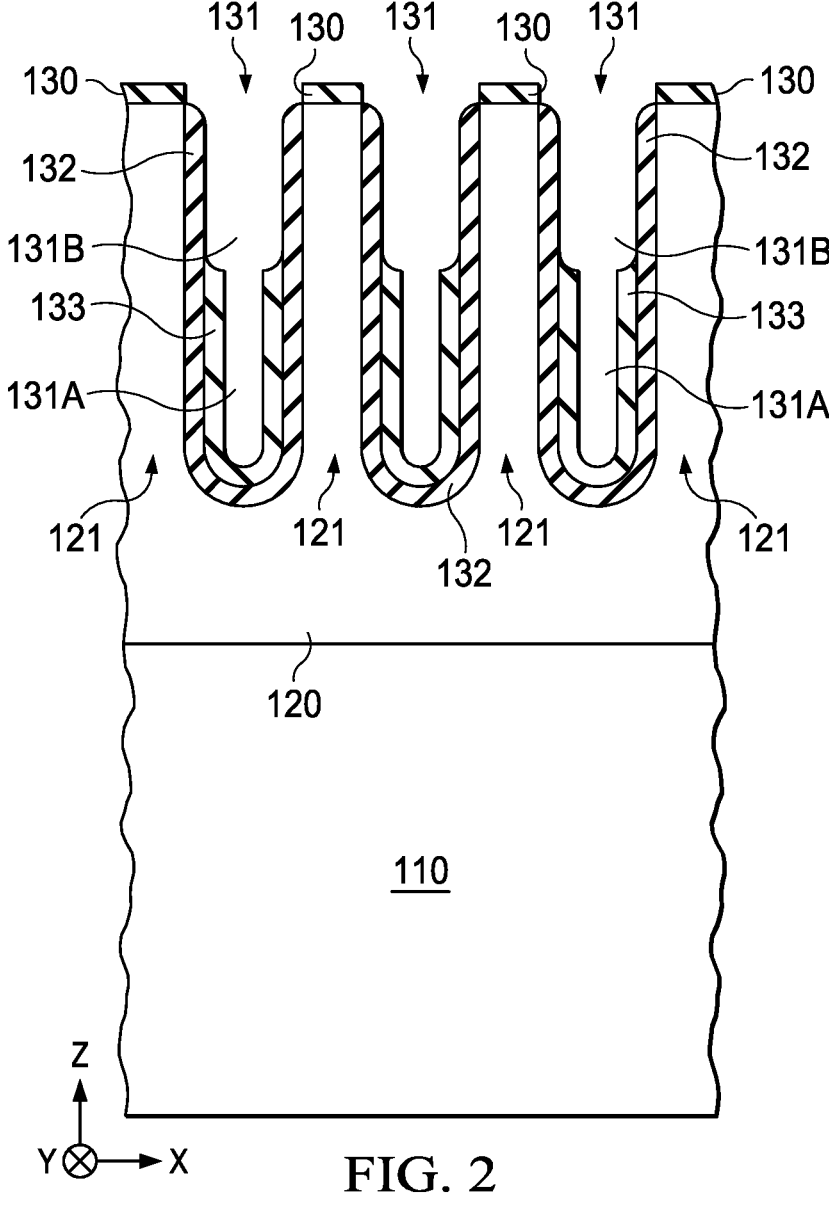

FIGS. 1 and 2 illustrate a semiconductor substrate 110, a semiconductor layer 120 on the semiconductor substrate 110, a silicon nitride layer 130 on the semiconductor layer 120, multiple trenches 131 in the semiconductor layer 120, and silicon oxide layers 132 and 133 over the inner walls of the multiple trenches 131. In FIG. 2, each of the multiple trenches 131 includes a first portion 131A and a second portion 131B that has a larger dimension (e.g. width) in the plane of the figure than the first portion 131A. In one example, the second portion 131B of the trench 131 is formed by etching away a portion of the oxide layer 133 shown in FIG. 1 with photoresist protecting the oxide layer 133 in the first portion 131A.

FIG. 9 illustrates the steps corresponding to FIGS. 1 and 2 as forming multiple trenches in a semiconductor layer (e.g., semiconductor layer 120) of a first conductivity type in step 901, and as forming oxide layers over inner walls of the multiple trenches in step 902. The first conductivity type may be p-type or n-type. In some examples, the semicon-ductor substrate 110 is a heavily doped silicon substrate, and the semiconductor layer 120 is a lightly doped epitaxial silicon layer. The multiple trenches 131 may be formed by patterning the silicon nitride layer 130 and by etching the exposed semiconductor layer 120. In some examples, etch-ing includes dry etching or reactive-ion etching. In certain examples, etching includes dry etching or reactive-ion etch-ing, and further includes chemical wet etching to smooth the shape or the surface of the trenches. Accordingly, the semi-conductor layer 120 includes multiple semiconductor regions 121, each semiconductor region 121 located between two neighboring trenches 131 as illustrated in FIGS. 1 and 2. The etched silicon nitride layer 130 may serve as a hard mask to protect multiple semiconductor regions 121 during the process of etching the semiconductor layer 120 to form the multiple trenches 131. In some examples, the oxide layer 132 is formed by thermal oxida-tion, and the oxide layer 133 is formed by plasma deposition.

FIGS. 1 and 2 also illustrate a coordinate system including X, Y, and Z axes. The X-axis and the Y-axis are orthogonal to each other and are parallel to a plane of the semiconductor substrate 110. The X and Y-axes are thus referred to as "in-plane direction." The Z-axis is orthogonal to the X and Y-axes and thus orthogonal to the plane of the cut-away view of the semiconductor substrate 110 shown in FIGS. 1 and 2. As such, the Z-axis is referred to as an "out-of-plane direction."

Figure 3:
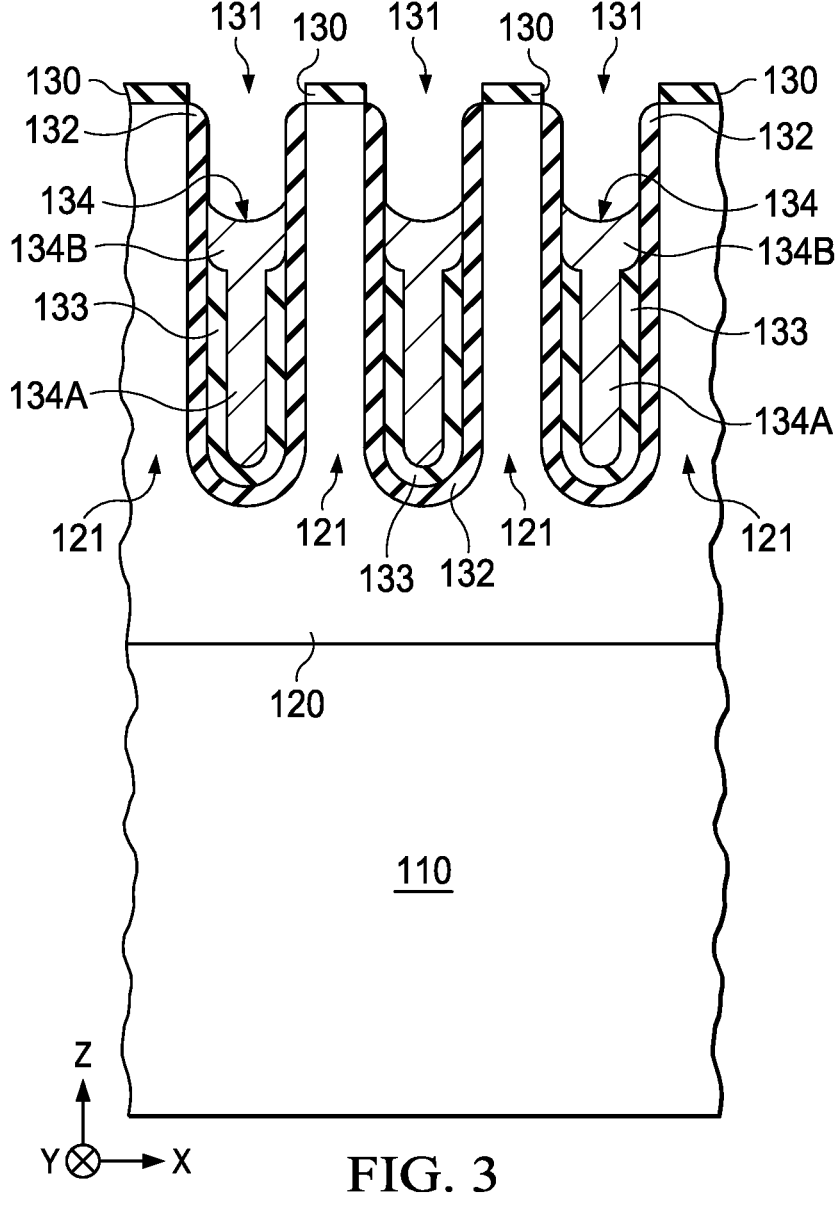
Figure 4:
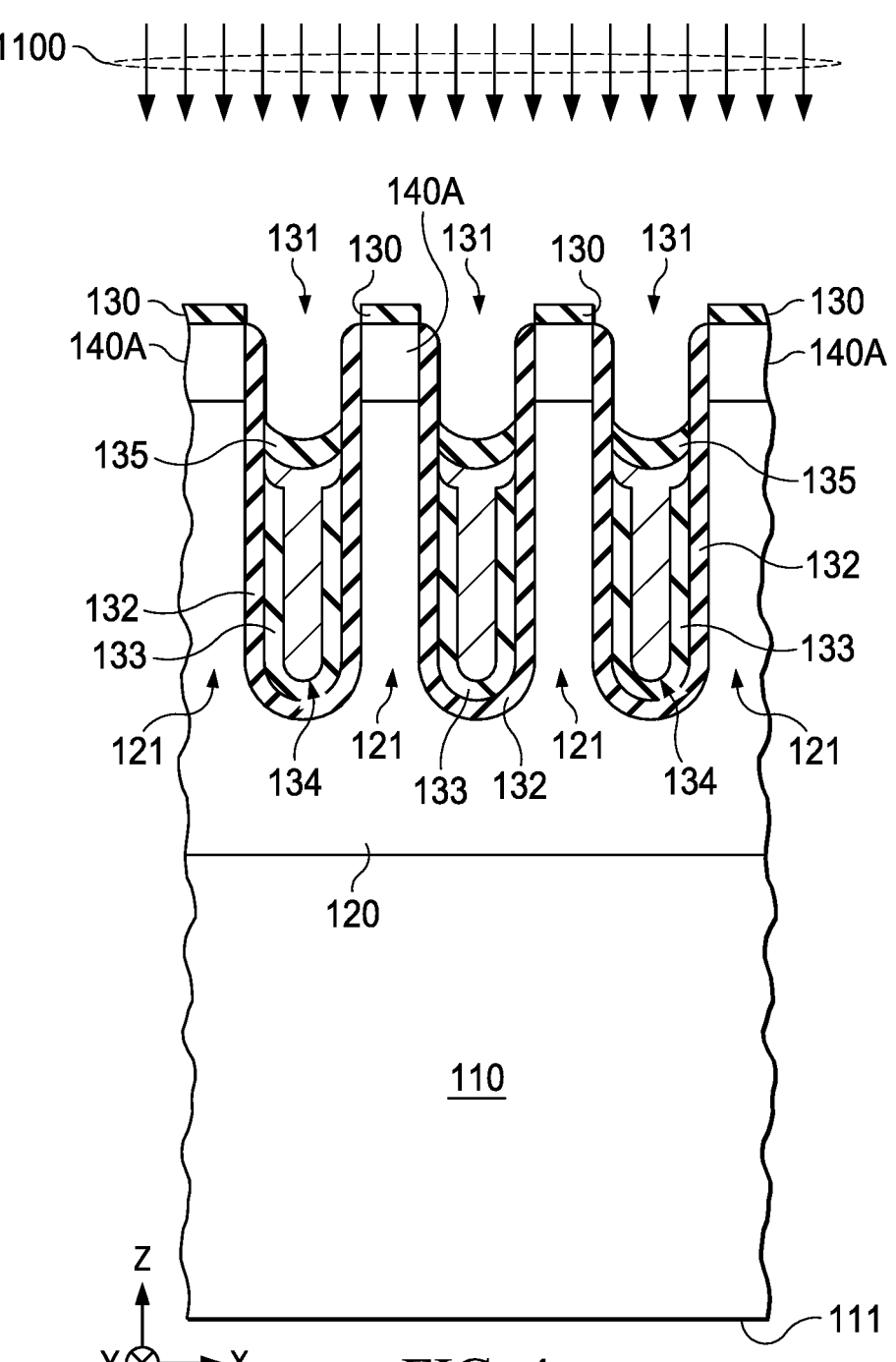

FIG. 3 illustrates multiple field plates 134 in the multiple trenches 131, respectively. FIG. 9 illustrates the correspond-ing step as forming field plates in the trenches in step 903 in FIG. 9. Each field plate 134 includes a first portion 134A and a second portion 134B that has a greater in-plane extent (e.g., width in the X-direction) than the first portion 134A. The field plates 134 may be formed from a polysilicon layer that is etched back to leave a remaining portion of polysilicon in each trench. In some examples, the polysilicon is heavily doped (e.g., with p-type or n-type conductivity) to provide relatively high conductivity. In other examples, the polysili-con can be lightly doped (e.g., with p-type or n-type con-ductivity) or undoped, FIG. 4 illustrates an oxide layer 135 over each field plate 134 and multiple first body members 140A of a second conductivity type in or over the semiconductor layer 120. The oxide layer 135 may be formed by thermal oxidation and/or deposition and partial removal of a plasma-based oxide. FIG. 9 illustrates the corresponding step of forming the first body members 140A as forming multiple first body members of a second conductivity type in or over the semiconductor layer 120 in step 904. The multiple first body members 140A may be formed by implanting dopants of the second conductivity type into the semiconductor layer 120 by a first implantation 1100 at a first implantation energy. In some examples, the first conductivity type is n-type, and the second conductivity type is p-type. In other examples, the first conductivity type is p-type, and the second conductivity type is n-type.

Figure 5:
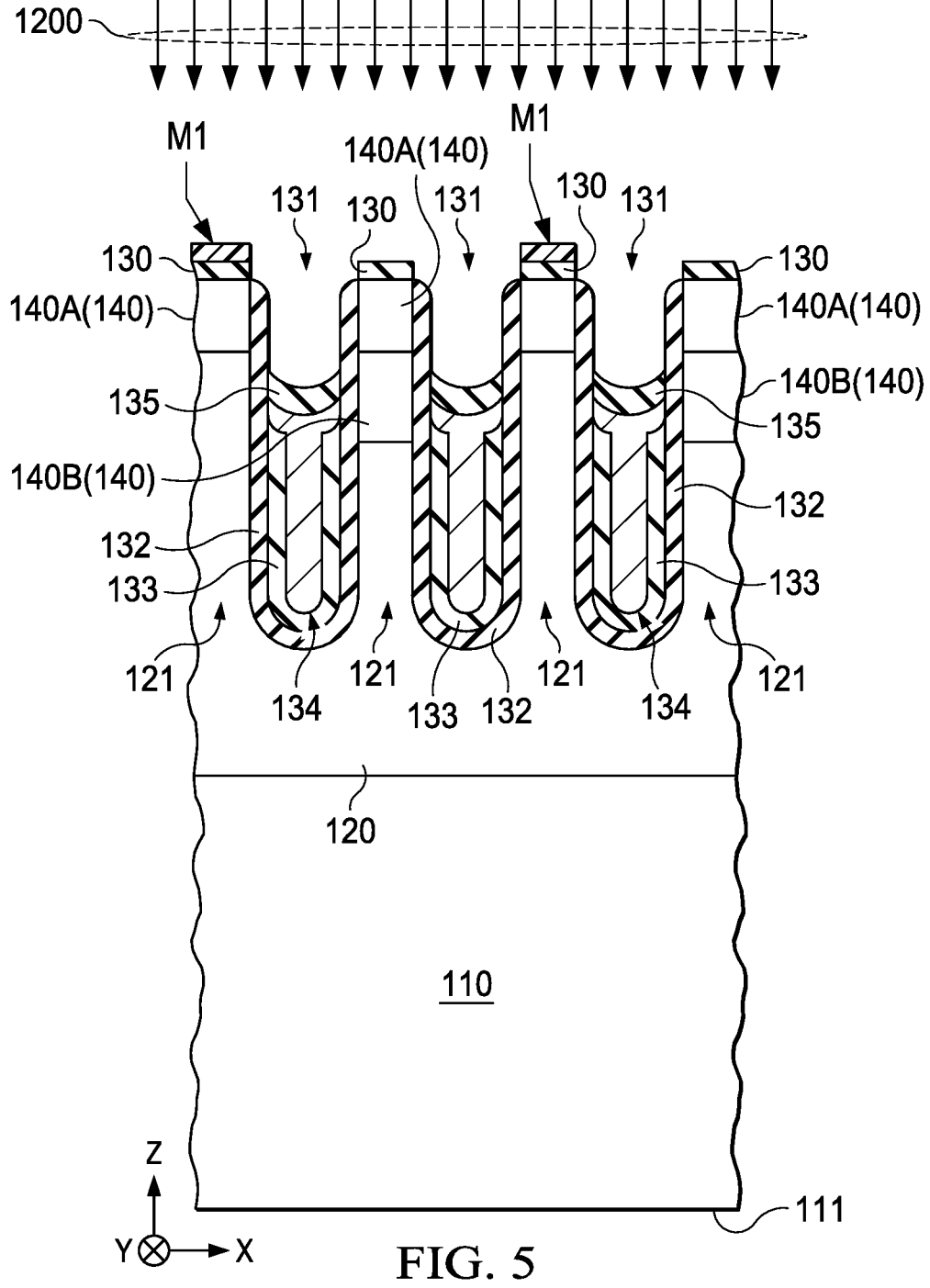

FIG. 5 illustrates extension body members 140B of a second conductivity type between first body members 140A and a drift region that includes the semiconductor regions 121 operating or serving as part of the drift region. FIG. 9 illustrates the corresponding step of forming the extension body members 140B as forming multiple extension body members of a second conductivity type between first body members and the drift region in step 905. The multiple extension body members 140B can be formed by implanting dopants of the second conductivity type into the semicon-ductor layer 120 by a second implantation 1200 at a second implantation energy with a patterned photoresist mask M1 (see, e.g., FIG. 5).

The second implantation energy for forming extension body members 140B is higher than the first implantation energy for forming the first body members 140A, such that dopants of the second implantation 1200 can reach deeper into the semiconductor layer 120 than dopants of the first implantation 1100, and the extension body members 140B are deeper into the semiconductor layer 120 than the first body members 140A. In some examples, the second implan-tation energy for forming extension body members 140B has a value in a range of 50 keV to 2000 keV. In certain examples, the second implantation energy for forming extension body members 140B is 130 keV, 195 keV, or 300 keV.

With the patterned photoresist mask M1, the extension body members 140B can be fractionally formed with respect to the first body members 140A. That is, some portions (but not necessarily all portions) of first body members 140A have corresponding extension body members 140B. In some examples only a proper subset of the first body members 140A have corresponding extension body members 140B. In the example of FIG. 5, some body structures 140 include first body members 140A and extension body members 140B, and other body structures 140 include first body members 140A without including extension body members 140B. Body structures (such as 140) of the present disclosure may be fractionally enhanced, where "fractionally" may mean some portions of the body structures are enhanced while other portions of the body structures are not enhanced, and "enhanced" may mean the implantation dosage is increased in the respective portions of the body structures, and accordingly, depths of the respective portions of the body structures may be extended (or increased), and/or doping concentrations of the respective portions of the body structures may be increased, as compared to non-enhanced portions of the body structures.

For example, some portions of first body members 140A have or are provided with corresponding extension body members 140B while other portions of first body members 140A do not have or are not provided with corresponding extension body members 140B, and accordingly, depths of the body structures 140 are fractionally or partially extended. In the example of FIG. 5, depths of some of the body structures 140 are extended or increased, as compared to depths of other of the body structures 140 that are not enhanced. Using the fractionally enhanced body structures 140, some channels of the transistors can be weakened or turned off, especially in the saturation region, and the drift resistance temperature coefficient can become more dominant as compared to positive temperature coefficient of the channel of the body structures. The increased dominance of drift resistance temperature coefficient can improve thermal stability of the example MOSFET integrated circuit 100.

The patterned photoresist mask M1 can expose and define regions corresponding to the extension body members 140B to form the extension body members 140B by the second implantation 1200, and protect other regions that are not intended to be implanted by the second implantation 1200. Further, oxide in or over the trenches (such as oxide layers 135) can protect components in the respective regions (e.g., under the oxide) from being implanted by the second implantation 1200. In some examples, the patterned photoresist mask M1 has a linear pattern and extends linearly along the Y direction; and the extension body member 140B has a linear pattern and also extends linearly along the Y direction. In some examples, by the second implantation 1200, depths of the body structures 140 in regions exposed and defined by the patterned photoresist mask M1 are increased or extended. In certain examples, by the second implantation 1200, doping concentrations of first body members 140A and/or extension body members 140B in regions exposed and defined by the patterned photoresist mask M1 are increased or larger, as compared to first body members 140A in regions protected by the patterned photoresist mask M1 from the second implantation 1200.

Figure 6:
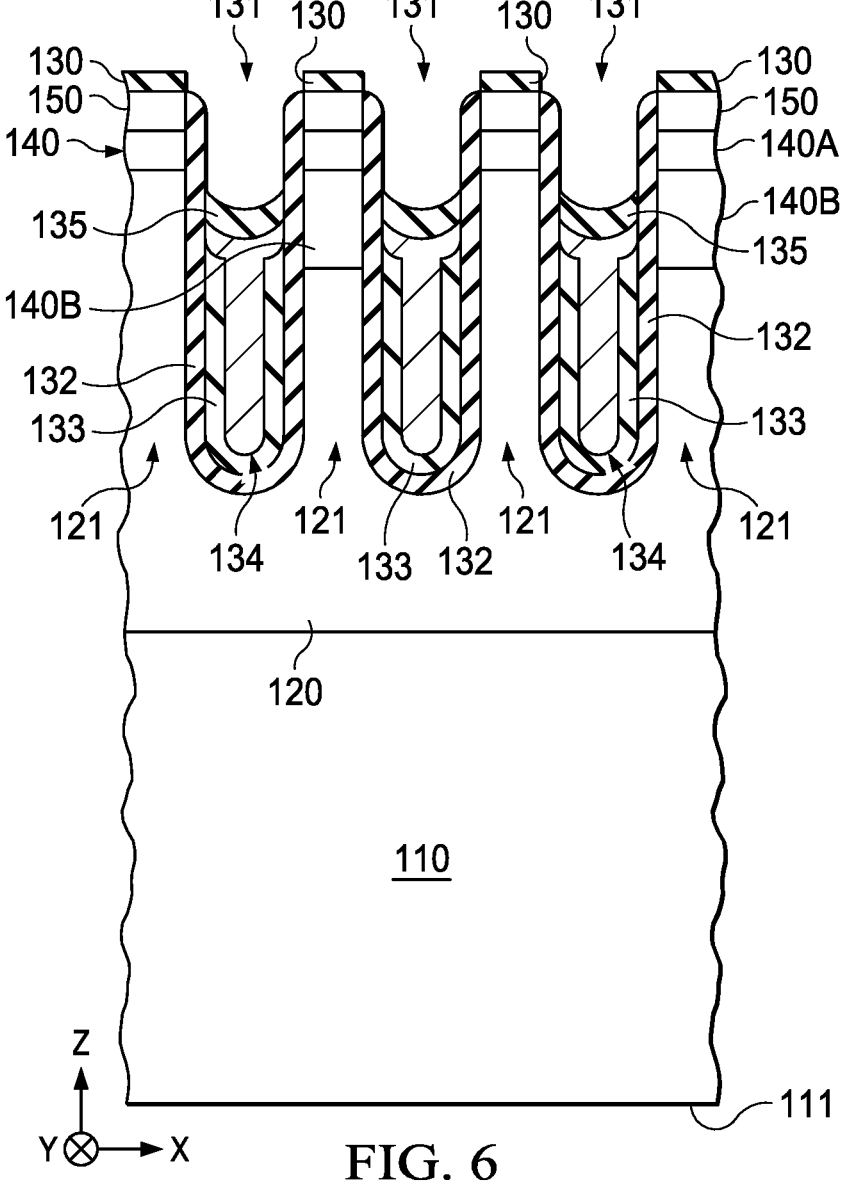

FIG. 6 illustrates multiple source regions 150 of the first conductivity type on or over the multiple first body members 140A of body structures 140 of the second conductivity type. FIG. 9 illustrates the corresponding step as forming a source region of the first conductivity type on or over each of the multiple first body members 140A of body structures 140 in step 906. The source regions 150 may be formed by implanting dopants of the first conductivity type into the semiconductor layer 120.

Figure 7:
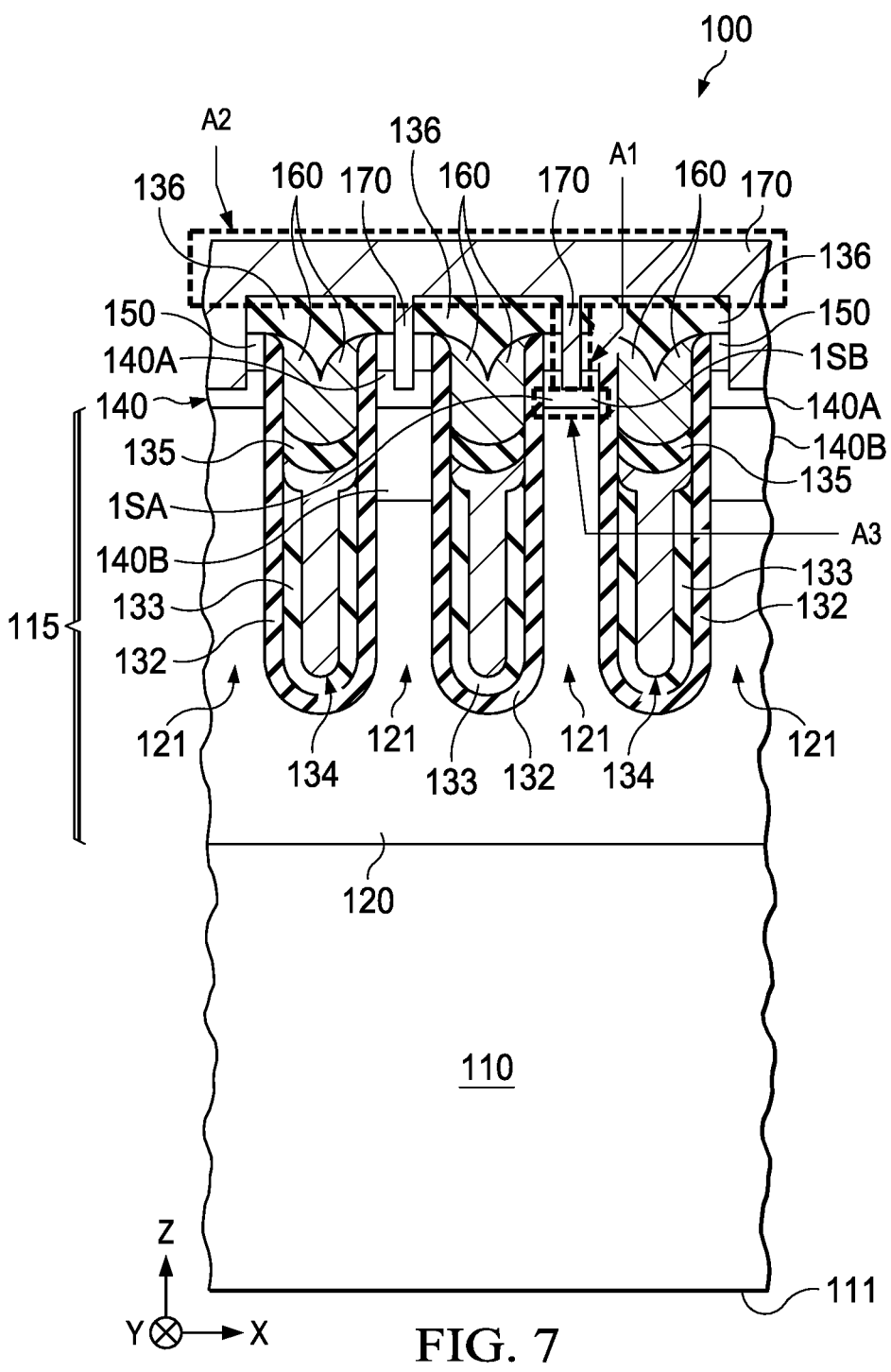

FIG. 7 illustrates multiple gates 160 (or gate structures) located over field plates 134, and source contacts 170, each source contact conductively connected to a corresponding one of the source regions 150. The gates 160 may be formed from polysilicon that is deposited as a single layer and etched back. FIG. 9 illustrates the corresponding steps as forming multiple gates 160 in the multiple trenches in step 907, and as forming source contacts 170 coupled to or in contact with source regions in step 908.

In the example of FIG. 7, each source contact 170 is coupled to or in contact with a corresponding source region 150, and in contact with a corresponding body structure 140. In other examples, each source contact 170 is coupled to a corresponding body structure 140 via a heavily-doped body contact region. The source contacts 170 are in contact with one another by way of a metal layer over the top of the integrated circuit to form an integral conducting member. The source contacts 170 include portions extending along the out-of-plane direction from the metal layer toward the body structures 140 (−Z direction along Z-axis) and conductively connected to the source regions 150 and the body structures 140 adjacent to the extended portions of the source contacts 170. The source contacts 170 may be formed by etching away a portion of each of the source regions 150, the body structures 140, and oxide layer 136 in areas A1. A refractory metal contact liner and metal such as aluminum may be deposited into the areas A1 and in the areas A2 above the areas A1. The source contacts 170 are conductively coupled to one another or integrated as one piece or an integral member by the metal layer in the area A2. In the example of FIG. 7, two side portions 1SA and 1SB of an example instance of the first body member 140A are physically connected by a bottom portion of the first body member 140A in an area A3. In other examples, first body members 140A that touch the same source contact 170 may be separated from each other by the source contact 170.

With continued reference to FIG. 7, each gate 160 is conductively isolated from a corresponding body structure 140 by the oxide layer 132, which operates as a gate dielectric. FIG. 7 also illustrates oxide layers 135 between the field plates 134 and the gates 160, and oxide layers 136 on the gates 160.

Figure 8:
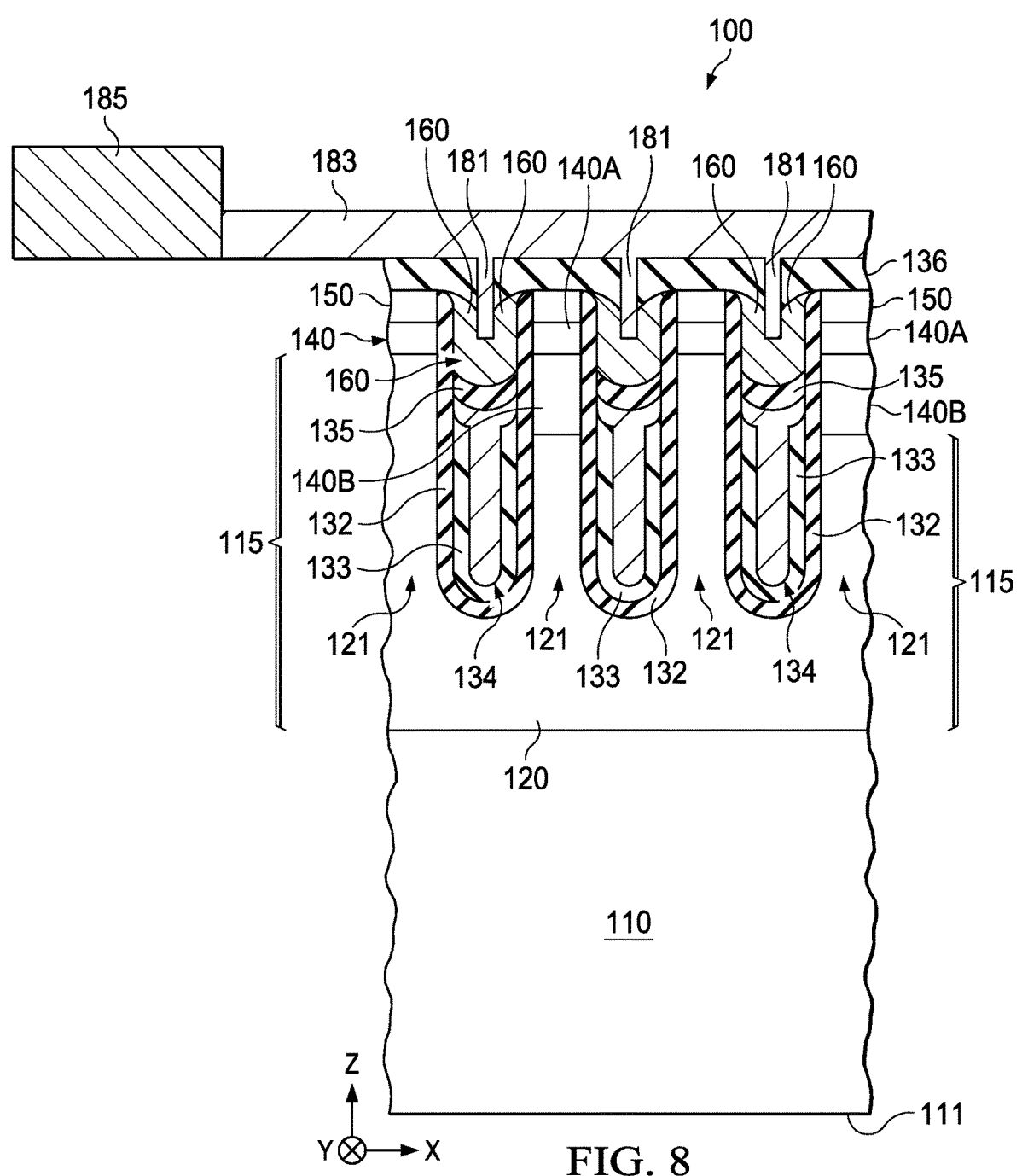

FIG. 8 illustrates gate contacts coupled to the gates. Further, a gate bus 183 and a gate pad 185 are coupled to the gate contacts 181 and thus coupled to gates 160. FIG. 9 illustrates the corresponding steps as forming gate contacts coupled to the gates in step 909, and forming a gate bus and a gate pad coupled to the gates in step 910.

FIGS. 7 and 8 illustrate schematic views of an example integrated circuit 100 according to described examples. For simplicity, not all structures of the integrated circuit 100 are shown in each individual figure of FIGS. 7 and 8. For example, the integrated circuit 100 includes the gate contacts (181), which are not shown in FIG. 7, but are shown in FIG. 8.

Referring to FIGS. 7 and 8, the integrated circuit 100 includes the semiconductor substrate 110 that has a surface 111 and the semiconductor layer 120 including multiple semiconductor regions 121. The semiconductor substrate 110 may be heavily doped and may operate as a drain region or drain contact for the integrated circuit 100. The semiconductor layer 120, which may be lightly doped, may operate as a drift region 115 of the integrated circuit 100, where the drift region 115 of the integrated circuit 100 includes a base drift region between the substrate 110 and the trenches 131, and the semiconductor regions 121 between the trenches 131 and in contact with body structures 140. The integrated circuit 100 further includes source regions 150 over the drift region 115, body structures 140 between the drift region 115 and respective source regions 150, and source contacts 170 in contact with respective source regions 150. As described above, the source contacts 170 may be coupled to one another to form an integral member. The integrated circuit 100 further includes gates 160 corresponding to the body structures 140, gate contacts 181, a gate bus 183, and a gate pad 185. The gates 160 and gate contacts 181 are coupled to the gate pad 185 via the gate bus 183.

In some examples, for having fractionally enhanced body structures, some body structures 140 may include both first body member 140A and extension body member 140B; and other body structures 140 may include first body member 140A without extension body member 140B. In certain examples, for having fractionally enhanced body structures, a body structure 140 has respective extension body member 140B in contact with some portions of first body member 140A of the body structure 140, and has no extension body member 140B in contact with other portions of first body member 140A of the body structure 140.

The extension body members 140B extend deeper into the semiconductor layer 120 than the first body members 140A. The extension body member 140B is between the first body member 140A and the drift region 115 and extends to a location farther than the gate 160 along a first direction (–Z direction) pointing from the source region 150 towards the respective drift region 115. The extension body members 1406 have a same conductivity type as the first body members 140A. In some examples, the extension body member has a doping concentration equal to or greater than the first body member 140A. In other examples, the extension body member has a doping concentration lower than the first body member 140A. The doping concentration of the extension body member can be chosen according to various application scenarios.

Figure 10:
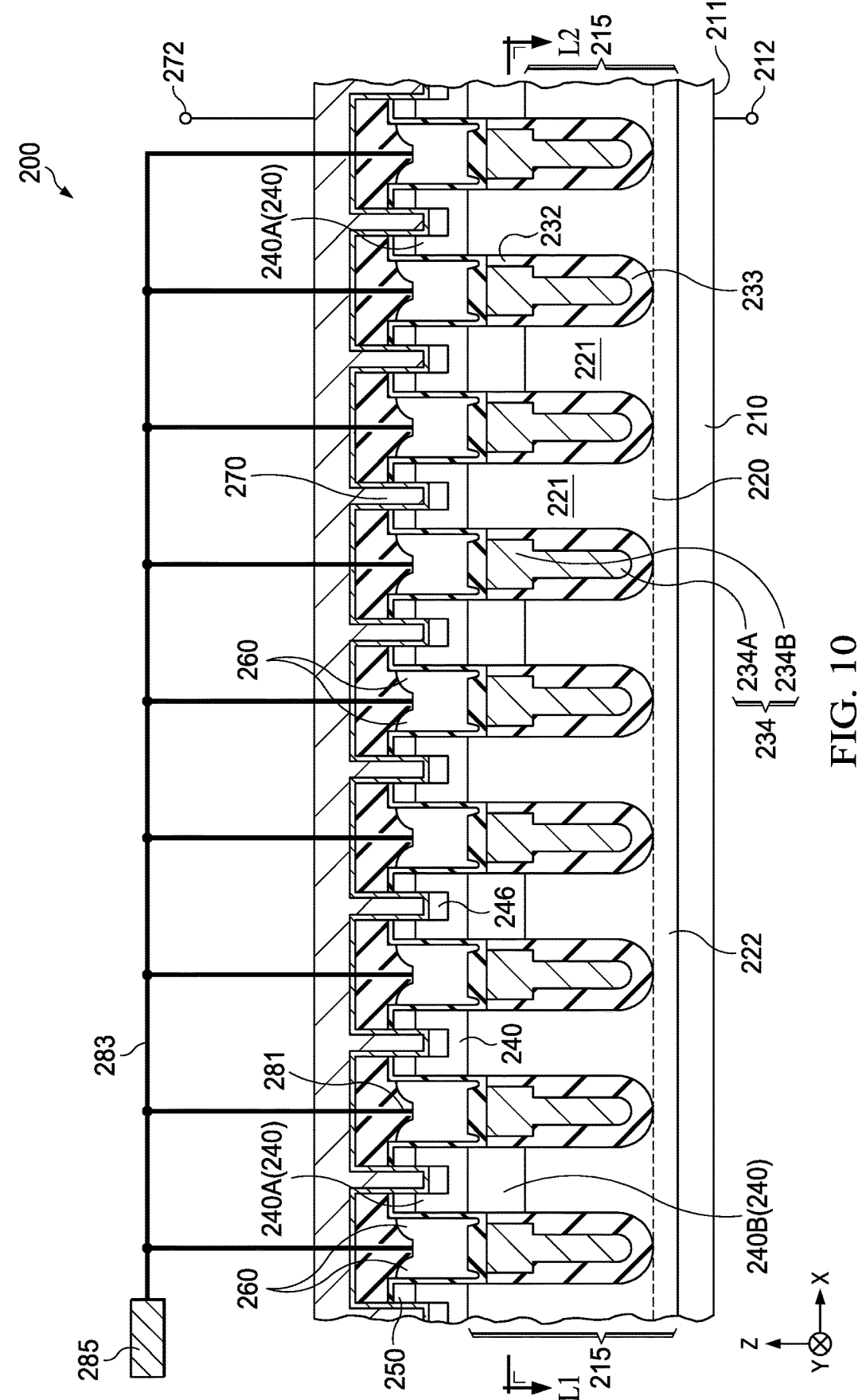
FIG. 10 illustrates a schematic view of another example integrated circuit according to described examples.

FIG. 10 illustrates a schematic view of another example integrated circuit 200 according to described examples. The integrated circuit 200 includes a semiconductor substrate 210 and a semiconductor layer 220 on or over the semiconductor substrate 210. The semiconductor layer 220 may be a lightly-doped epitaxial layer. The integrated circuit 200 further include body structures 240, source regions 250, source contacts 270, gates (or gate structures) 260 located between the body structures 240 and between the source regions 250 along X direction, and heavily-doped body contact regions 246 in contact with the body structures 240 and for having ohmic connection with the body structures 240. The heavily-doped body contact regions 246 have a higher doping concentration than the body structures 240. The gates 260 face toward the respective body structures 240. The integrated circuit 200 further includes gate contacts 281, a gate bus 283, a gate pad 285, field plates 234, dielectric layers (e.g., 232, 233), a drain terminal 212, and a source terminal 272. The field plate 234 includes a first portion 234A and a second portion 234B. The semiconductor substrate 210 has a surface 211. The semiconductor layer 220 includes multiple semiconductor regions 221.

The drift region 215 of the integrated circuit 200 is in the semiconductor layer 220. The drift region 215 of the integrated circuit 200 includes a base drift region 222 and multiple semiconductor regions 221 that serve as multiple branch drift regions. The semiconductor substrate 210 may be heavily doped and may serve as a drain region of the integrated circuit 200.

The source regions 250 are over the drift region 215, and the body structure 240 is between the drift region 215 and the source region 250. The source contact 270 is coupled to and in contact with a source region 250. The source contacts 270 are coupled to one another to form an integral member. Gates 260 are coupled to the gate pad 285 via the gate bus 283.

The extension body members 240B can be fractionally formed with respect to the first body members. For example, some portions (but not necessarily all portions) of first body members 240A have corresponding extension body members 240B. In the example of FIG. 10, some body structures 240 include first body members and extension body members 240B, and other body structures 240 include first body members without including extension body members 240B. Accordingly, body structures 240 are fractionally enhanced (or fractionally extended). Using the fractionally enhanced (or fractionally extended) body structures 240, some channels of the transistors can be weakened or turned off, especially in the saturation region, channel density can be reduced, and the drift resistance temperature coefficient can become more dominant as compared to the channel of the body structures. The increased dominance of drift resistance temperature coefficient can improve thermal stability of the example MOSFET integrated circuit 200. The first body members 240A may extend linearly along Y axis.

In certain examples, a material of the gate 260 includes polycrystalline silicon, aluminum, or any other suitable material. Further, the field plate 234 may comprise polycrystalline silicon or other suitable material. The source contact 270 may be a metal.

Figure 11:
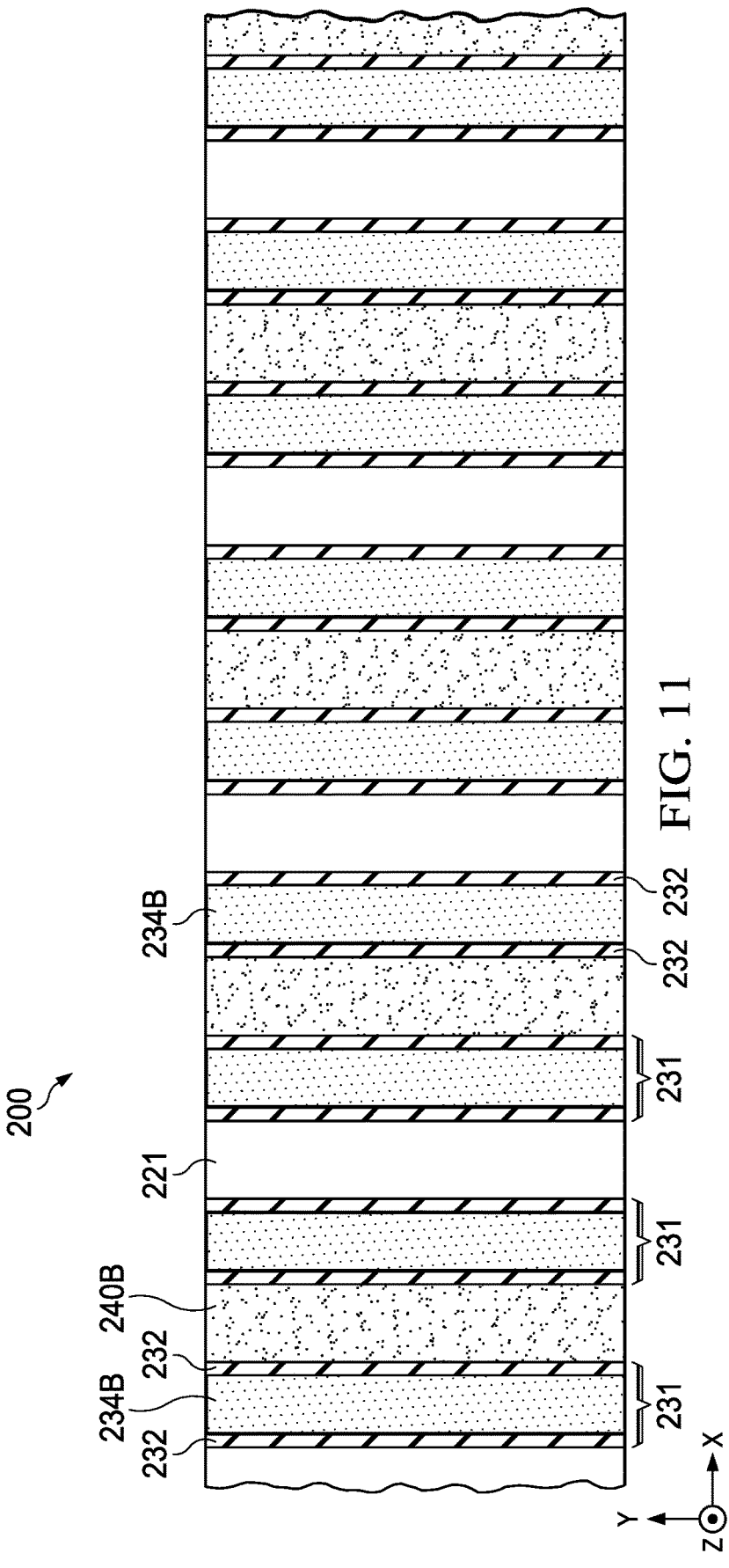
FIG. 11 illustrates a cross-sectional view of the integrated circuit of FIG. 10 according to described examples.

FIG. 11 illustrates a cross-sectional view of the integrated circuit 200 and across L1-L2 of FIG. 10 according to described examples. Referring to FIG. 11, each trench 231 has a field plate 234 (see the second portion 234B of field plate 234 shown in FIG. 11) and dielectric layers 232 therein. Between at least some adjacent trenches 231 or between at least some adjacent field plates 234, extension body members 240B are present and in contact with first body members 240A (see FIG. 10). The extension body member 240B extends linearly along Y axis, and is in contact with the first body members 240A extending linearly along Y axis. Between certain adjacent trenches 231 or between certain adjacent field plates 234, there are no extension body members 240B. Accordingly, body structures 240 are fractionally enhanced (or extended).

Figure 12:
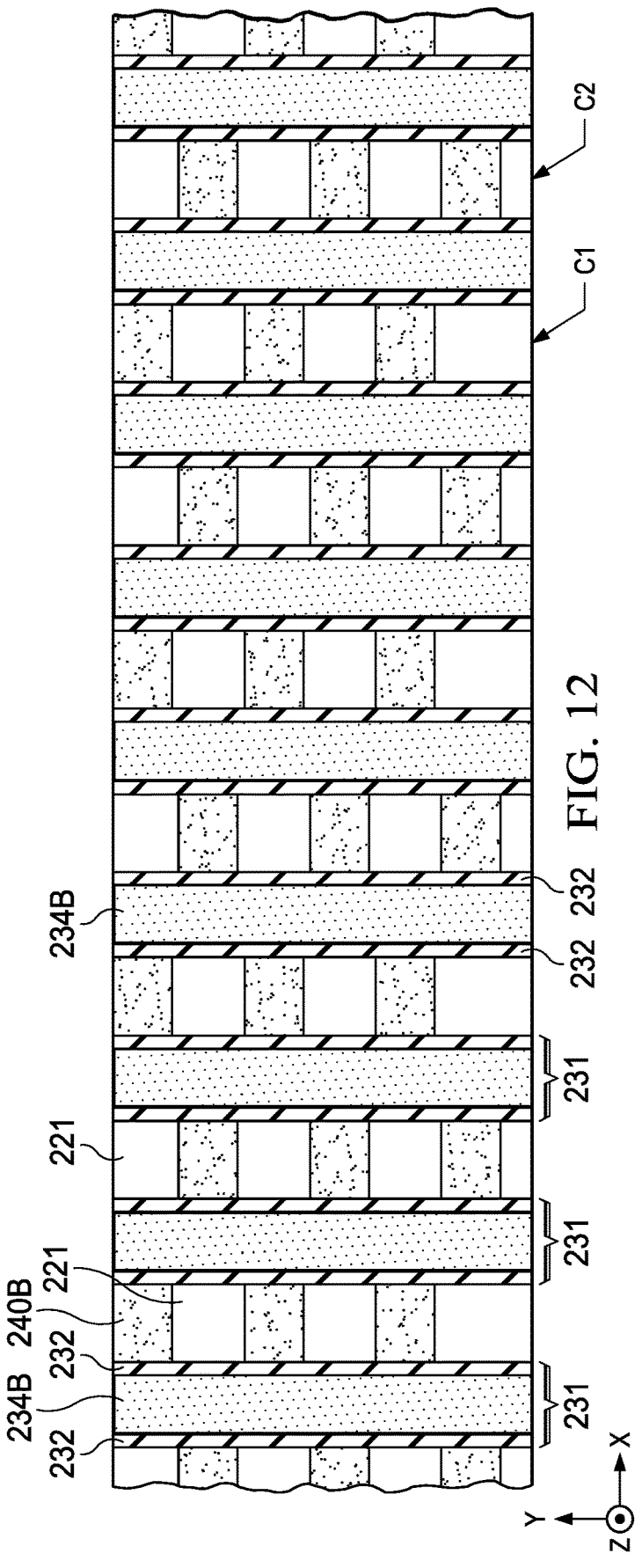
FIG. 12 illustrates a cross-sectional view of another example configuration for an integrated circuit according to described examples.

In the example of FIG. 11, the extension body members 240B have a linear pattern, extend linearly along Y axis. FIG. 12 illustrates a cross-sectional view of another example configuration for an integrated circuit according to described examples, in which the extension body members 240B have a dotted pattern.

Referring to FIG. 12, each trench 231 has a field plate 234 (see the second portion 234B of field plate 234 shown in FIG. 11) and dielectric layers 232 therein. Between at least two adjacent trenches 231 or between at least two adjacent field plates 234, there are extension body members 240B in contact with first body members 240A. The extension body members 240B have a dotted pattern. For example, there are multiple spaced-apart extension body members 240B between at least two adjacent trenches 231 and in contact with a first body members 240A that extends linearly along Y axis. The dotted pattern of the extension body members may be an array, and accordingly, the extension body members may be arranged in an array.

In the example of FIG. 12, multiple spaced-apart extension body members 240B in a first column (C1) have a location shift along Y axis, as compared to multiple spaced-apart extension body members 240B in a second column (C2) that is adjacent to the first column (C1).

In other examples, multiple spaced-apart extension body members 240B in the first column have no location shift along Y axis, as compared to multiple spaced-apart extension body members 240B in the second column that is adjacent to the first column. For example, the multiple spaced-apart extension body members 240B are arranged in an rectangular or square array.

A patterned photoresist mask can be used to expose and define regions corresponding to the extension body members 140B and to form the extension body members 240B with the dotted pattern by ion implantation (such as the second implantation 1200), and protect or shield other regions from being implanted by the ion implantation.

In some examples, the patterned photoresist mask has a stripe or linear pattern extending linearly along X direction; and oxide in or over the trenches extends along Y direction and can protect components in the respective regions (e.g., under the oxide) from being implanted by ion implantation (such as the second implantation 1200); and accordingly, multiple spaced-apart extension body members 240B can be formed and arranged in a rectangular or square array.

In the present disclosure, the extension body members 240B can have linear pattern, dotted pattern such as an array, random spatial arrangement, and/or any other suitable spatial configuration to fractionally enhance (or extend) the body structures 240. The configuration of extension body members 240B can be chosen according to various application scenarios.

Figure 13:
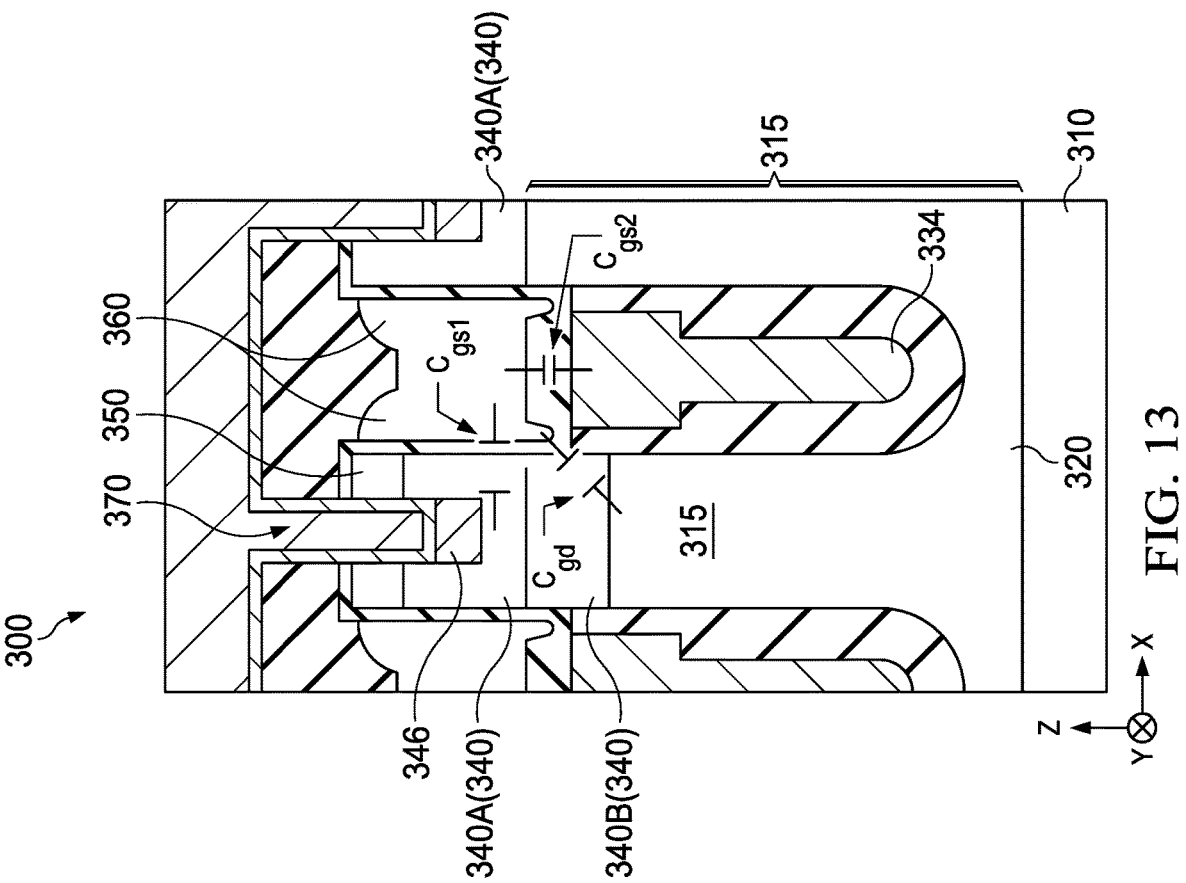
FIG. 13 illustrates a schematic view of another example integrated circuit according to described examples.

FIG. 13 illustrates a schematic view of another example integrated circuit 300 according to described examples. The integrated circuit 300 includes a semiconductor substrate 310 and a semiconductor layer 320 on or over the semiconductor substrate 310, and drift region 315 formed in the semiconductor layer 320. The semiconductor substrate 310 can serve as a drain region of transistor of the integrated circuit 300. The integrated circuit 300 further includes body structures 340, source regions 350, source contacts 370, and gates (or gate structures) 360 located between the body structures 340 and between the source regions 350 along X direction. The body structures 340 include first body members 340A, and some of the body structures 340 further include extension body members 340B in contact with respective first body members 340A to fractionally enhance (or extend) the body structures 340.

The extension body members 340B extend deeper into the semiconductor layer 320 than the first body members 340A. The extension body member 340B is between the first body member 340A and the drift region 315 and extends to a location farther than the gate 360 along a first direction (−Z direction) pointing from the source region 350 towards the respective drift region 315. The deeper extension body member 340B can facilitate shielding gates 360 from the drain region (e.g., semiconductor substrate 310), and accordingly reduce gate-to-drain capacitance (C9$d$). Gate-to-source capacitance (C9$s$) can include a first component (C9$s$1) of gate-to-source capacitance and a second component (C9$s$2) of gate-to-source capacitance, where the second component (C9$s$2) of gate-to-source capacitance occurs as the field plate 334 is electrically coupled to the source region via certain conductive path (not shown in FIG. 13).

A voltage v(t) with a ramp rate (dv/dt) applied to a MOSFET integrated circuit may induce a displacement current to unexpectedly turn on the integrated circuit or a MOSFET device of the integrated circuit. When a MOSFET circuit in switching application switches at a very high speed, the resulting rise in the gate voltage can be calculated according to $V_{gs} \approx v(t) \cdot (1/(1+(C_{gs}/C_{gd})))$, or $V_{gs} \approx v(t) \cdot (1/(1+(1/RR)))$, where RR is the ratio of $C_{gd}$ to $C_{gs}$. Therefore, by reducing the ratio RR of $C_{gd}$ to $C_{gs}$, the induced rise in the gate voltage can be reduced, and accordingly, the risk of the self turn-on (false turn-on) can be reduced. The deeper extension body member 340B of the integrated circuit 300 can facilitate shielding gates 360 from the drain region (e.g., semiconductor substrate 310), and reduce gate-to-drain capacitance ($C_{gd}$). Further, the deeper extension body member 340B can increase gate-to-source capacitance ($C_{gs}$) and reduce gate-to-drain capacitance ($C_{gd}$) at the same time. Accordingly, the ratio of $C_{gd}$ to $C_{gs}$ can be reduced, and the risk of the self turn-on of the integrated circuit 300 can be reduced.

Figure 14:
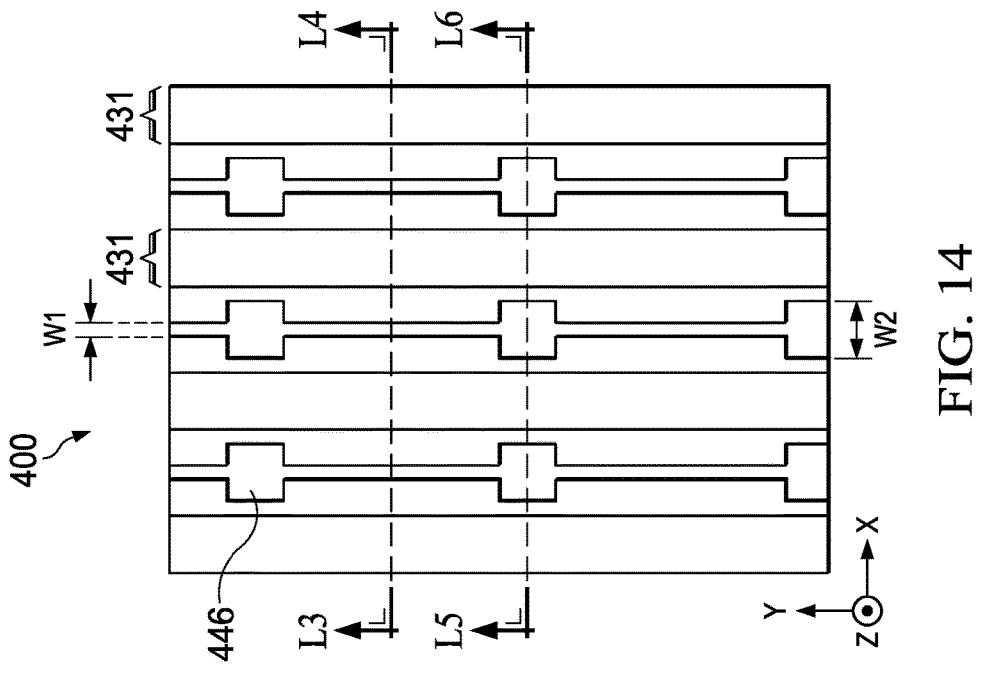
FIG. 14 illustrates a schematic view of an example configuration of another integrated circuit with factionally fractionally widened heavily-doped contact regions.
Figure 15A:
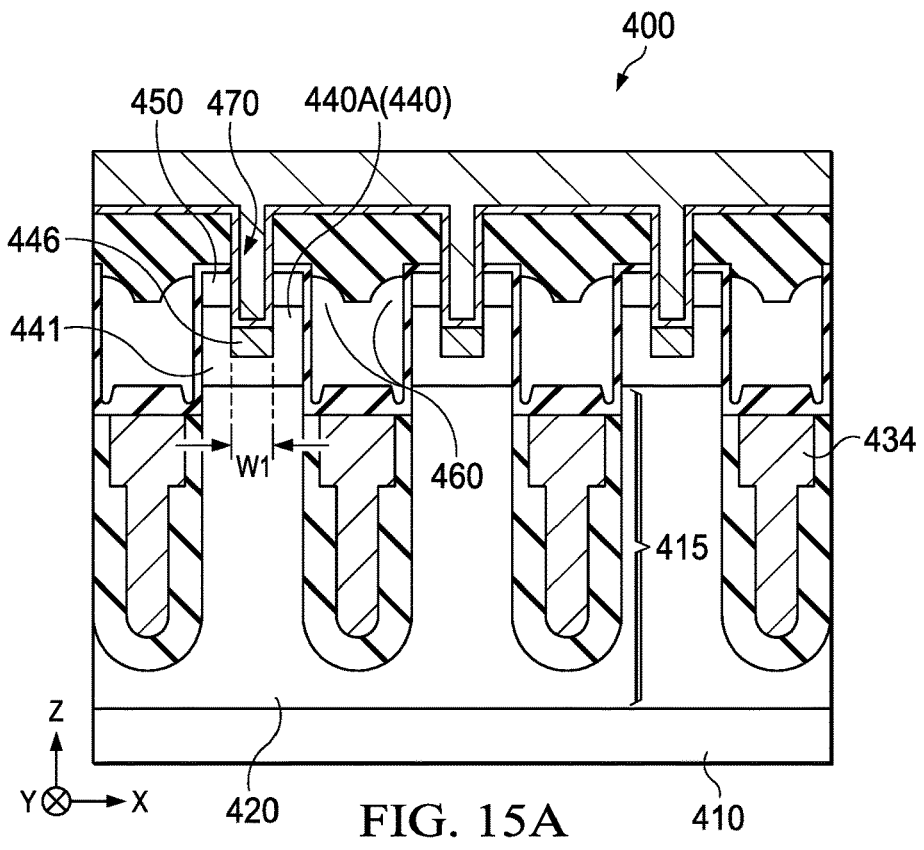
FIG. 15A illustrates an example cross-section view of the integrated circuit of FIG. 14.

A MOSFET-based integrated circuit of the present disclosure may include fractionally widened, heavily-doped contact regions 346 that are in contact with the body structures and have ohmic connection with the body structures. FIG. 14 illustrates a schematic view of another example configuration of an integrated circuit 400 with fractionally widened heavily-doped contact regions. FIG. 15A illustrates an example cross-section view of the integrated circuit 400 across L3-L4 of FIG. 14, FIG. 15B illustrates another example cross-section view of the integrated circuit 400 across L5-L6 of FIG. 14.

Referring to FIG. 14, the MOSFET-based integrated circuit 400 includes trenches 431, and fractionally widened heavily-doped body contact regions 446. The fractionally widened heavily-doped body contact regions 446 have some portions (e.g., non-widened portions) with width W1 and widened portions with widened (larger) width W2 that is larger than width W1.

Figure 15B:
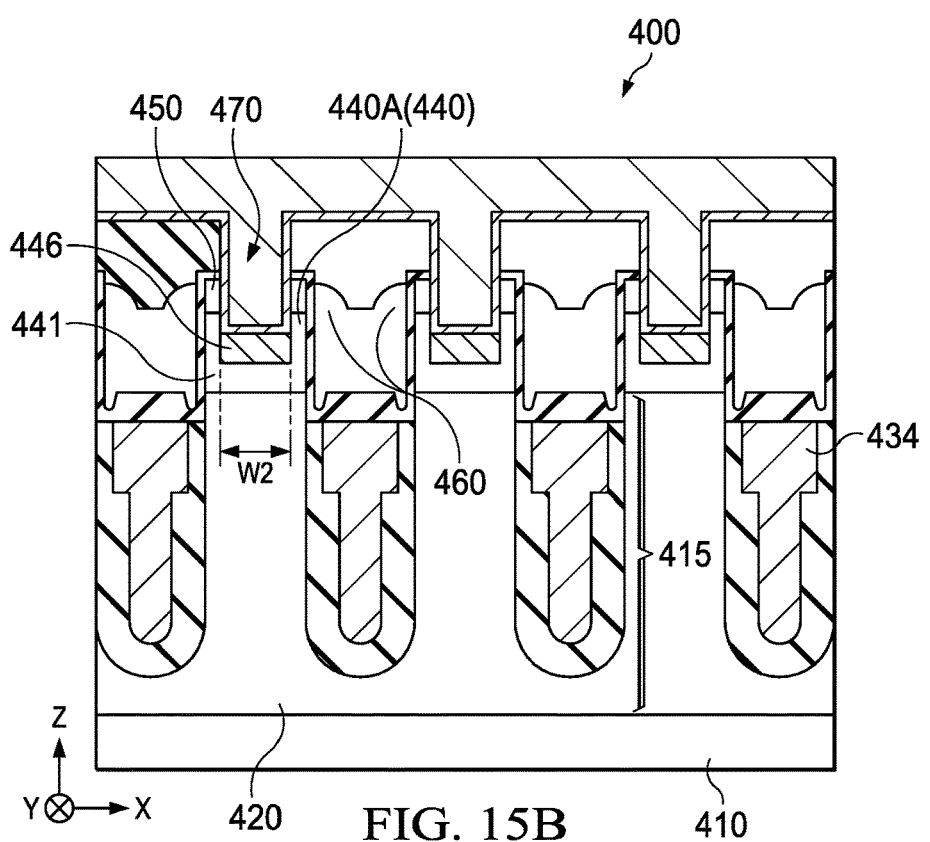
FIG. 15B illustrates another example cross-section view of the integrated circuit of FIG. 14.

Referring to FIGS. 15A and 15B, the integrated circuit 400 includes a semiconductor substrate 410 and a semiconductor layer 420 on or over the semiconductor substrate 410, and drift region 415 formed in the semiconductor layer 420. The semiconductor substrate 410 can serve as a drain region of MOSFET of the integrated circuit 400. The integrated circuit 400 further includes field plates 434, body structures 440, source regions 450, source contacts 470, and includes gates (or gate structures) 460 located between the body structures 440 and between the source regions 450 along X direction. The integrated circuit 400 may further include gate contacts, a gate bus, and a gate pad coupled to the gates. The body structures 440 include first body members 440A. The integrated circuit 400 includes fractionally widened heavily-doped body contact regions 446. The heavily-doped body contact regions 446 include some portions with width W1 and other portions with widened (larger) width W2 that is larger than width W1. The widened portions with widened (larger) width W2 of heavily-doped body contact regions 446 can shield, disable, or weaken respective channels 441 adjacent to the widened portions; and thus the fractionally widened heavily-doped body contact regions 446 can shield, disable, or weaken partial channels 441. Accordingly, channel density can be reduced, and thermal stability can be improved in the integrated circuit 400.

In certain examples, a first body contact region in contact with a first body structure includes at least one portion having a larger width than at least one portion of a second body contact region in contact with a second body structure.

Figure 16B:
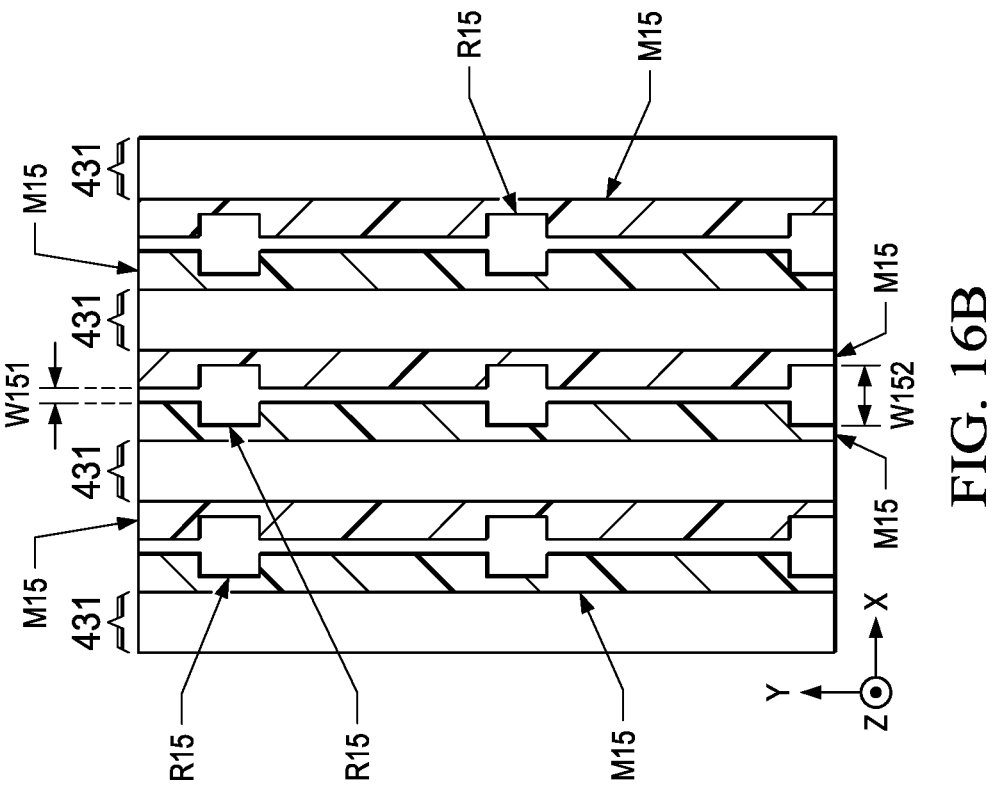
FIG. 16B illustrates an example photoresist contact mask for forming fractionally widened heavily-doped body contact regions.
Figure 16A:
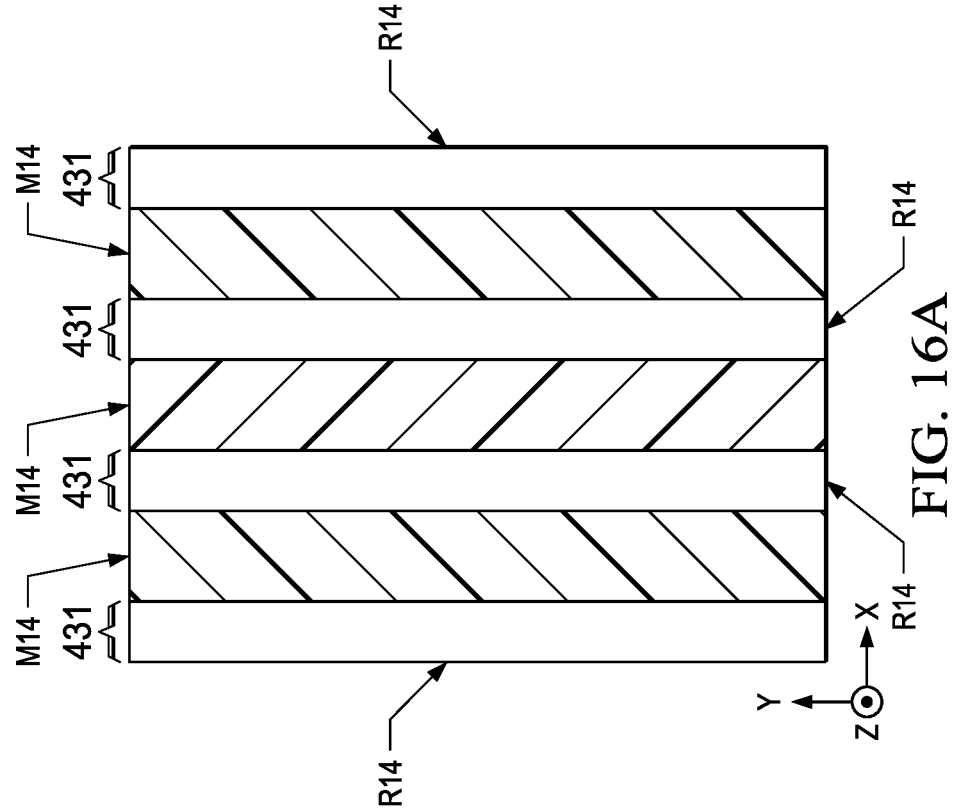
FIG. 16A illustrates an example mask for forming trenches.

FIG. 16A illustrates an example mask for forming trenches. The example mask M14 can be a patterned photoresist mask that exposes and defines regions R14 of or over a respective silicon substrate or layer in which trenches 431 can be formed. For example, the example mask M14 can be on or over a silicon substrate or layer, and expose and define areas R14 of the silicon substrate or layer. Silicon in areas R14 of the silicon substrate or layer can be etched to form trenches 431 in the silicon substrate or layer, while silicon under or protected by the mask M14 is reserved.

FIG. 16B illustrates an example photoresist contact mask for forming fractionally widened heavily-doped body contact regions. The patterned photoresist contact mask M15 exposes and defines areas R15 with a width W151 and a widened (larger) width W152 that is larger than width W151, such that, by ion implantation, dopants can go through exposed areas R15 defined by the patterned photoresist mask M15 to form fractionally widened heavily-doped body contact regions 446 (in, e.g., FIG. 14, 15A, 15B). In the example of FIG. 16B, the patterned photoresist contact mask M15 does not cover areas of trenches 431, because areas of trenches 431 may be already protected by oxide when forming fractionally widened heavily-doped body contact regions 446. In other examples, the patterned photoresist contact mask M 15 can extend to cover areas of trenches 431. Because widened (larger) width W152 is larger than width W151, corresponding widened portion of heavily-doped body contact regions 446 formed by dopant implantation through widened width W152 has a larger width W2 (as compared to width W1). Further, the widened portions of heavily-doped body contact regions 446 can receive more implanted dopants, and the widened portions (and junction between the widened portions and body structures) are deeper and wider as compared to non-widened portions of heavily-doped body contact regions 446, and accordingly, respective channels in the body structures can be weaken or disabled. In some examples, width W2 of widened portions of heavily-doped body contact regions 446 is equal to or great than respective width W152 of areas R 15; and width W1 of non-widened portions of heavily-doped body contact regions 446 is equal to or great than respective width W151 of areas R15. In some examples, the same patterned photoresist contact mask M15 and exposed regions R15 can be used for forming cavities in which materials of source-contacts can be deposited.

Since a contact mask is already in the processes for forming the integrated circuit (such as the integrated circuit of FIG. 10, 14), the use of the patterned photoresist contact mask M15 for forming fractionally widened heavily-doped body contact regions does not introduce an extra mask, and the fabrication cost can be reduced. Respective channels in the body structures can be weaken or disabled by fractionally widened heavily-doped body contact regions, without introducing an extra mask in the fabrication.

Figure 17:
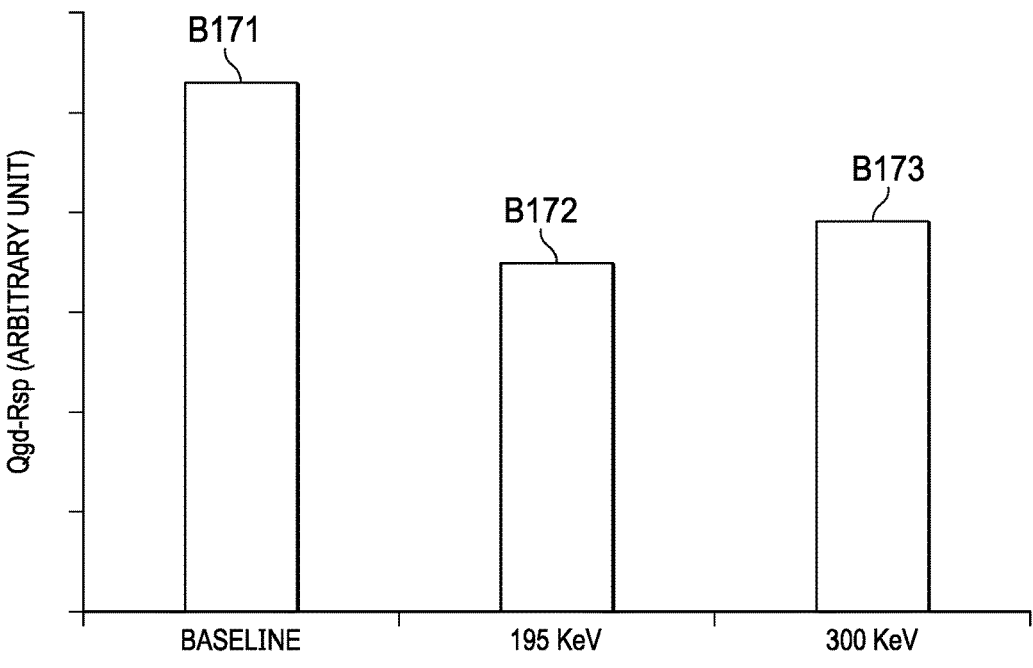
FIG. 17 illustrates figure-of-merit of example integrated circuits in comparison with a baseline integrated circuit.

FIG. 17 illustrates figure-of-merit of example integrated circuits in comparison with a baseline integrated circuit. Example integrated circuit with extension body members formed by implantation at an implantation energy of 195 keV (see B172) and example integrated circuit with extension body members formed by implantation at an implantation energy of 300 keV (see B173) each have smaller $Q_{gd} \cdot R_{sp}$ than the baseline integrated circuit (see B171), where $Q_{gd}$ is gate-to-drain charge and $R_{sp}$ is specific on-resistance. Example integrated circuits have improved figure-of-merit ($Q_{gd} \cdot R_{sp}$) as compared to the baseline integrated circuit. Example integrated circuits (such as the integrated circuits 100, 200) include extension body members, and can reduce gate-to-drain capacitance ($C_{gd}$), gate-to-drain charge ($Q_{gd}$), and reduce $Q_{gd} \cdot R_{sp}$, as compared to the baseline integrated circuit.

Figure 18:
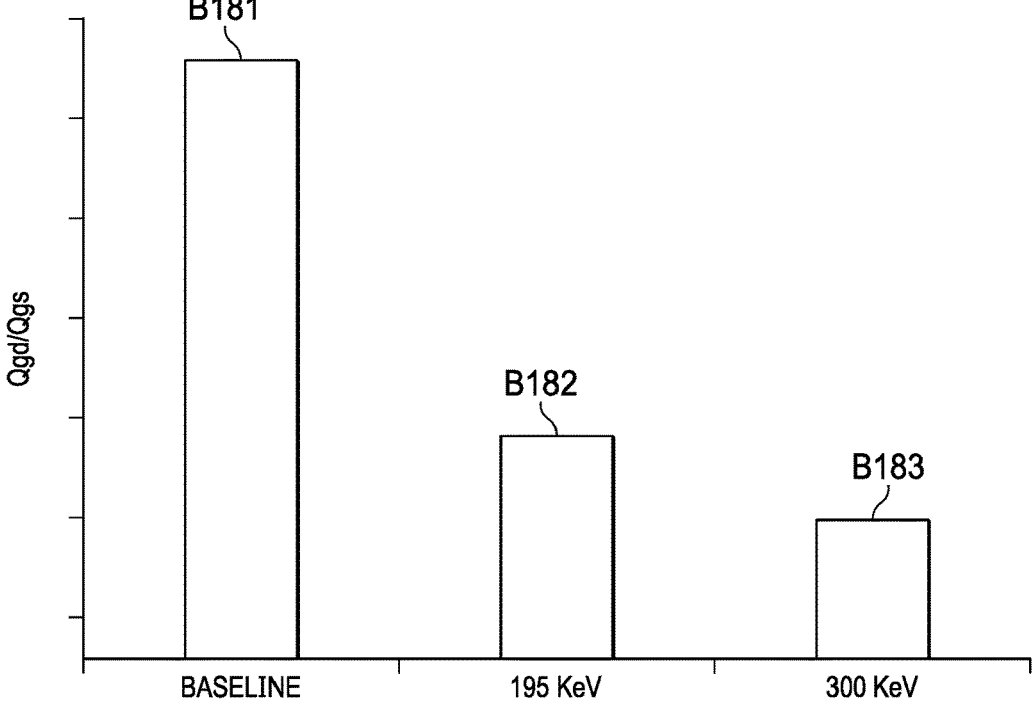
FIG. 18 illustrates ratio of gate-to-drain charge to gate-to-source charge of example integrated circuits in comparison with a baseline integrated circuit.

FIG. 18 illustrates ratio of gate-to-drain charge to gate-to-source charge of example integrated circuits in comparison with a baseline integrated circuit. Example integrated circuits with extension body members formed by implantation at an implantation energy of 195 keV (see B182) and example integrated circuits with extension body members formed by implantation at an implantation energy of 300 keV (see B183) each have smaller $Q_{gd}/Q_{gs}$ (i.e., ratio of gate-to-drain charge to gate-to-source charge) than the baseline integrated circuit (see B181), where $Q_{gd}$ is gate-to-drain charge and $Q_{gs}$ is gate-to-source charge. In the example integrated circuits (such as the integrated circuits 100, 200), with the reduced ratio of gate-to-drain charge to gate-to-source charge in the example integrated circuits, the risk of the self turn-on can be reduced or eliminated.

FIG. 19 illustrates SOA improvement in example integrated circuits as compared a baseline integrated circuit. Under operation without self-damage, example integrated circuits with 50% channel being deactivated (see B192, B292) and example integrated circuits with 75% channel being deactivated (see B193, B293) have larger drain current ($I_d$) than corresponding baseline integrated circuits (see B191, B291) at various drain voltages ($V_{dd}$). Accordingly, example integrated circuits (such as the integrated circuits 100, 200) have improved SOA as compared to the baseline integrated circuit.

In the present disclosure, integrated circuits can include fractionally enhanced (or extended) body structures and/or fractionally widened (and/or deepened) heavily-doped contact regions, to disable or weaken partial channel of MOSFETs of the integrated circuit. Accordingly, thermal SOA can be improved.

A MOSFET channel has a positive temperature coefficient, meaning that the hotter it gets, the higher the current will be. This can result in positive feedback and have thermal runaway or hotspot formed, and therefore the device or circuit can fail or be burnt before it reaches chip thermal limit (because the energy are focused on one spot). Electrical SOA is limited by the avalanche/breakdown failure governed by the critical electric field at which the device avalanche occurs and is associated with the device design that has different electric field distribution. Thermal SOA is limited by the chip thermal resistivity from the substrate/package, and the failure is often a result of silicon reaches maximum junction temperature with pn junction failure. The thermal SOA can be degraded if there is hot spot formed due to positive temperature coefficient. By partially disable or weaken channels of MOSFETs of the integrated circuit, the effect of positive temperature coefficient of MOSFET channels can be reduced, and the drift resistance temperature coefficient can become more dominant as compared to positive temperature coefficient of MOSFET channels. Accordingly, thermal SOA can be improved.

The transistor-based integrated circuits of the present disclosure can include, but not limited to, vertical-trench-gate FET-based integrated circuits (shown in, e.g., FIG. 10). For example, transistor-based integrated circuits of the present disclosure can include laterally diffused metal oxide semiconductor (LDMOS) transistor integrated circuits, or other suitable FET integrated circuits.

Modifications, additions, or omissions may be made to the systems, apparatuses, and methods described herein without departing from the scope of the disclosure. Moreover, the operations of the systems and apparatuses disclosed herein may be performed by including more, fewer, or other components; and the methods described may include more, fewer, or other steps. Additionally, steps may be performed in any suitable order.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Modifications are possible in the described embodiments, and other embodiments are possible, within the scope of the claims.

What is claimed is:

1. A method of forming an integrated circuit, comprising:
forming first, second and third trenches in an epitaxial layer having a first conductivity type over a substrate;
forming corresponding first, second and third polysilicon field plates within the first, second and third trenches;
forming a first source region between the first and second trenches, and a second source region between the second and third trenches, the first and second source regions having the first conductivity type;
forming a first body region having an opposite second conductivity type between the first and second trenches and between the first source region and the epitaxial layer, the first body region having a first depth below a top surface of the epitaxial layer, the first body region being formed by a first implantation process having a first implantation energy; and
forming a second body region having the opposite second conductivity type between the second and third trenches and between the second source region and the epitaxial layer, the second body region having a greater second depth below the top surface, the second body region including a first portion and a second portion, the first portion being formed by the first implantation process having the first implantation energy and a second implantation process having a second implantation energy greater than the first implantation energy, and the second portion being formed by the second implantation process.

2. The method of claim 1, further comprising forming a first body contact electrically connected to the first body region and having a first width between the first and second trenches, and forming a second body contact electrically connected to the second body region and having a greater second width between the second and third trenches.

3. The method of claim 1, wherein the first, second and third polysilicon field plates have a top at a third depth below the top surface, the first depth being less than the third depth and the second depth being greater than the third depth.

4. The method of claim 1, further comprising forming third and fourth body regions located between the first and second trenches, the third body region extending the second depth between the top surface and the substrate and the fourth body region extending the first depth between the top surface and the substrate, the fourth body region located between the first and the third body regions.

5. The method of claim 1, further comprising forming a third body region located between the third trench and a fourth trench, the third body region extending the first depth between the top surface and the substrate.

6. The method of claim 5, wherein the first body region has a lateral width between the first and second trenches and the third body region has the lateral width between the third and fourth trenches, and the first and third body regions extend laterally parallel to the first, second, third and fourth trenches by a length that is at least two times the lateral width.

7. A method of forming an integrated circuit, comprising:
forming first, second and third trenches in an epitaxial layer located over a semiconductor substrate, the epitaxial layer having a first conductivity type and a top surface;
forming first, second and third field plates respectively within the first, second and third trenches;
forming a first source region between the first and second trenches, and a second source region between the second and third trenches, the first and second source regions having the first conductivity type;
forming a first body member within the epitaxial layer between the first and second trenches and between the first source region and the epitaxial layer, the first body member having a different second conductivity type and extending into the epitaxial layer a first distance between the top surface and the substrate, the first body member including a first portion and a second portion, the first portion being formed by a first implantation process having a first implantation energy and a second implantation process having a second implantation energy greater than the first implantation energy, and the second portion being formed by the second implantation process; and
forming a second body member within the epitaxial layer between the second and third trenches and between the second source region and the epitaxial layer, the second body member having the different second conductivity type and extending into the epitaxial layer a lesser second distance between the top surface and the substrate, the second body member being formed by the first implantation process having the first implantation energy.

8. The method of claim 7, wherein the first, second and third field plates each have a top at a depth below the top surface, the first distance being greater than the depth and the second distance being less than the depth.

9. The method of claim 7, further comprising forming third and fourth body members located between the first and second trenches, the third body member extending the first distance between the top surface and the substrate and the fourth body member extending the second distance between the top surface and the substrate, the fourth body member located between the first and the third body members.

10. The method of claim 7, further comprising forming a third body member between the third trench and a fourth trench and a fourth body member located between the second and third trenches, the third body member extending the first distance between the top surface and the substrate, and the fourth body member extending the first distance between the top surface and the substrate, the fourth body member located directly between the first and the third body members.

11. The method of claim 7, further comprising forming a third body member located between the third trench and a fourth trench, the third body member extending the first distance between the top surface and the substrate.

12. The method of claim 11, wherein the first body member has a lateral width between the first and second trenches and the third body member has the lateral width between the third and fourth trenches, and the first and third body members extend laterally parallel to the first, second, third and fourth trenches by a length that is at least two times the lateral width.

13. The method of claim 11, further comprising forming a fourth body member located between the second and third trenches and extending the first distance between the top surface and the substrate, the second body member located directly between the first and third body members.

14. A method of forming an integrated circuit, comprising:

forming trenches in an epitaxial layer having a first conductivity type over a substrate;

forming a polysilicon field plate within a bottom portion of each of the trenches;

forming a gate above the polysilicon field plate within each of the trenches;

forming source regions having the first conductivity type between adjacent pairs of the trenches;

forming body regions having an opposite second conductivity type extending from respective ones of the source regions to the epitaxial layer, a first subset of the body regions having a first depth below a top surface of the epitaxial layer, and a second subset of the body regions having a greater second depth below the top surface of the epitaxial layer and a bottom surface of the gate within each of the trenches.

15. The method of claim 14, further comprising forming a first body contact electrically connected to a first body region of the body regions and having a first width between a first trench and a second trench of the trenches, and forming a second body contact electrically connected to a second body region of the body regions and having a greater second width between the second trench and a third trench of the trenches.

16. The method of claim 15, wherein first, second and third polysilicon field plates have a top at a third depth below the top surface, the first depth being less than the third depth and the second depth being greater than the third depth.

17. The method of claim 15, wherein forming the body regions comprises forming third and fourth body regions located between the first and second trenches, the third body region extending the second depth between the top surface and the substrate and the fourth body region extending the first depth between the top surface and the substrate, the fourth body region located between the first and the third body regions.

18. The method of claim 15, wherein forming the body regions comprises forming a third body region located between the third trench and a fourth trench, the third body region extending the first depth between the top surface and the substrate.

19. The method of claim 18, wherein the first body region has a lateral width between the first and second trenches and the third body region has the lateral width between the third and fourth trenches, and the first and third body regions extend laterally parallel to the first, second, third and fourth trenches by a length that is at least two times the lateral width.

\* \* \* \* \*